US012751197B1

(12) United States Patent
Kamtekar et al.

(10) Patent No.: US 12,751,197 B1
(45) Date of Patent: Sep. 29, 2026

(54) COMPOSITION

(71) Applicant: Sumitomo Chemical Co., Ltd., Tokyo (JP)

(72) Inventors: Kiran Kamtekar, Godmanchester (GB); Sophie Jones, Godmanchester (GB); Nir Yaacobi-Gross, Godmanchester (GB)

(73) Assignee: Sumitomo Chemical Co., Ltd., Tokyo (JP)

( * ) Notice: Subject to any disclaimer, the term of this patent is extended or adjusted under 35 U.S.C. 154(b) by 761 days.

(21) Appl. No.: 17/963,912

(22) Filed: Oct. 11, 2022

Related U.S. Application Data

(63) Continuation-in-part of application No. 17/122,797, filed on Dec. 15, 2020, now Pat. No. 12,137,612, (Continued)

(30) Foreign Application Priority Data

Nov. 30, 2018 (GB) ..................................... 1819625

(51) Int. Cl.
*H01L 51/00* (2006.01)
*H10F 10/17* (2025.01)
(Continued)

(52) U.S. Cl.
CPC ........... *H10K 85/211* (2023.02); *H10F 10/17* (2025.01); *H10K 30/30* (2023.02)

(58) Field of Classification Search
None
See application file for complete search history.

(56) References Cited

U.S. PATENT DOCUMENTS 11,600,785 B2 * 3/2023 Kamtekar .............. H10K 30/30
2014/0373912 A1 12/2014 Uetani et al.
(Continued)

FOREIGN PATENT DOCUMENTS

CN 107 011 361 A 8/2017
JP H08-51232 A 2/1996
(Continued)

OTHER PUBLICATIONS

International Search Report and Written Opinion mailed Mar. 7, 2022, in connection with International Application No. PCT/EP2021/085841.
(Continued)

*Primary Examiner* — Long Pham
(74) *Attorney, Agent, or Firm* — Wolf, Greenfield & Sacks, P.C.

(57) ABSTRACT

A composition comprising an electron donor a fullerene electron acceptor and a non-fullerene electron acceptor wherein the non-fullerene electron acceptor is a compound of formula (I):

$$\text{EAG}—\text{EDG}—\text{EAG} \quad \text{(I)}$$

(Continued)

wherein each EAG is an electron accepting group; and EDG is an electron-donating group of formula (II) or (III):

(II)

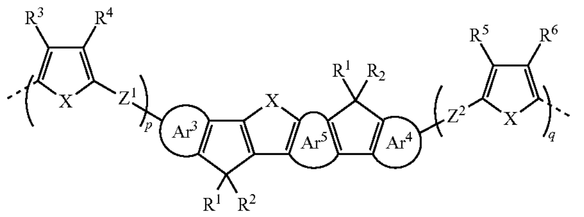

(III)

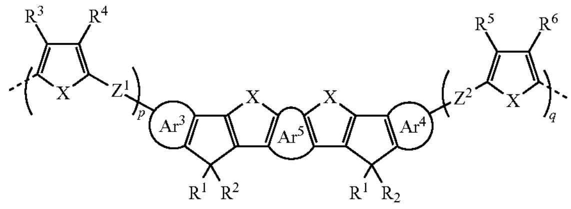

The composition may be used as a photosensitive layer of an organic photodetector.

20 Claims, 11 Drawing Sheets

Related U.S. Application Data which is a continuation-in-part of application No. PCT/GB2019/053394, filed on Nov. 29, 2019.

(51) Int. Cl.
*H10K 30/30* (2023.01)
*H10K 85/20* (2023.01)

(56) References Cited

U.S. PATENT DOCUMENTS

| | | | | |
|---|---|---|---|---|
| 2019/0157581 | A1* | 5/2019 | Seifrid | H10K 85/657 |
| 2021/0135129 | A1 | 5/2021 | Kamtekar et al. | |
| 2021/0175426 | A1* | 6/2021 | Yaacobi-Gross | H10K 85/215 |
| 2021/0395272 | A1* | 12/2021 | Yaacobi-Gross | H10K 85/655 |
| 2023/0094427 | A1 | 3/2023 | Kamtekar et al. | |
| 2023/0097966 | A1* | 3/2023 | Rodriguez-Martinez | H10K 85/113 257/40 |

FOREIGN PATENT DOCUMENTS

| | | | |
|---|---|---|---|
| JP | 2000-156292 | A | 6/2000 |
| JP | 2012-515438 | A | 7/2012 |
| JP | 2012-186462 | A | 9/2012 |
| JP | 2015-056585 | A | 3/2015 |
| JP | 2017-508974 | A | 3/2017 |
| WO | WO 2011/052709 | A1 | 5/2011 |
| WO | WO 2013/047858 | A1 | 4/2013 |
| WO | WO 2018/036914 | A1 | 3/2018 |
| WO | WO 2018/065350 | A1 | 4/2018 |
| WO | WO 2018/065352 | A1 | 4/2018 |
| WO | WO 2018/065356 | A1 | 4/2018 |
| WO | WO 2018/166232 | A1 | 9/2018 |
| WO | WO 2019/090229 | A1 | 5/2019 |
| WO | WO 2019/137354 | A1 | 7/2019 |
| WO | WO 2020/109822 | A1 | 6/2020 |
| WO | WO 2020/109823 | A1 | 6/2020 |
| WO | WO 2020/109825 | A2 | 6/2020 |

OTHER PUBLICATIONS

Japanese Office Action dated Aug. 31, 2023, in connection with Japanese Application No. 2020-553622.

Japanese Notice of Reasons for Refusal dated Nov. 9, 2023, in connection with Japanese Application No. 2022-562877.

Jiang et al., Bay-linked perylene bisimides as promising non-fullerene acceptors for organic solar cells. Royal Society of Chemistry. Sep. 20, 2013.50:1024-1026. DOI: 10.1039/c3cc47204c.

Li et al., Efficient Organic Solar Cells with Non-Fullerene Acceptors. Advanced Science News. Small Journal.2017. 15 Pages.

Miao et al., Highly Sensitive Organic Photodetectors with Tunable Spectral Response Under Bi-Directional Bias. Advanced Optical Materials. 2016.1711-1717.

Zhang et al., Effect of Hole Transport Layers on the Performance of Organic Optoelectronic Devices based on PBDB-T:ITIC Bulk Heterojunction. Advances in Engineering Research. vol. 110. 3rd Annual International Conference on Advanced Material Engineering (2017). 5 Pages.

Zhao et al. Single-Junction Binary-Blend Norfullerene Polymer Solar Cells with 12.1% Efficiency. Advanced Science News.2017. 7 Pages.

Yao et al. Design, Synthesis, and Photovoltaic Characterization of a Small Molecular Acceptor with an Ultra-Narrow Band Gap. Angewandte Chemie International Edition. Mar. 6, 2017;56(11):3045-49.

Ans et al., Opto-electronic properties of non-fullerene fused-undecacyclic electron acceptors for organic solar cells. Computational Materials Science. Mar. 1, 2019;159:150-59.

Gao et al., A New Nonfullerene Acceptor with Near Infrared Absorption for High Performance Ternary-Blend Organic Solar Cells with Efficiency over 13%. Advanced Science. Mar. 25, 2018;5(6). 6 Pages.

International Search Report and Written Opinion mailed Jul. 8, 2020, in connection with International Application No. PCT/GB2019/053394.

Combined Search and Examination Report dated Jul. 1, 2019, in connection with GB Application No. 1819625.3.

Japanese Notice of Reasons for Refusal dated Feb. 3, 2023, in connection with Japanese Application No. 2021-530135.

* cited by examiner

COMPOSITION

RELATED APPLICATIONS

This application is a continuation-in-part of and claims priority under 35 U.S.C. § 120 to U.S. patent application Ser. No. 17/122,797, filed Dec. 15, 2020, which is a continuation-in-part of International PCT Application, PCT/GB2019/053394, filed Nov. 29, 2019, which claims priority to United Kingdom Patent Application, GB 1819625.3, filed on Nov. 30, 2018, each of which is incorporated herein by reference.

BACKGROUND

Embodiments of the present disclosure relate to compositions and the use thereof in organic photodetectors.

A range of organic electronic devices comprising organic semiconductor materials are known, including organic light-emitting devices, organic field effect transistors, organic photovoltaic devices and organic photodetectors (OPDs).

WO 2018/065352 discloses an OPD having a photoactive layer that contains a small molecule acceptor which does not contain a fullerene moiety and a conjugated copolymer electron donor having donor and acceptor units.

WO 2018/065356 discloses an OPD having a photoactive layer that contains a small molecule acceptor which does not contain a fullerene moiety and a conjugated copolymer electron donor having randomly distributed donor and acceptor units.

Yao et al, "Design, Synthesis, and Photovoltaic Characterization of a Small Molecular Acceptor with an Ultra-Narrow Band Gap", Angew Chem Int Ed Engl. 2017 Mar. 6; 56(11):3045-3049 discloses a non-fullerene acceptor with a band gap of 1.24 eV.

Li et al, "Fused Tris(tbienothiophene)-Based Electron Acceptor with Strong Near-Infrared Absorption for High-Performance As-Cast Solar Cells", Advanced Materials, Vol. 30(10), 2018 discloses a fused octacyclic electron acceptor (FOIC) for solar cells.

Gao et al, "A New Non-fullerene Acceptor with Near Infrared Absorption for High Performance Ternary-Blend Organic Solar Cells with Efficiency over 13%" Advanced Science, Vol. 5(6), June 2018 discloses a solar cell containing an acceptor-donor-acceptor (A-D-A) type non-fullerene acceptor 3TT-FIC which has three fused thieno[3,2-b]thiophene as the central core and difluoro substituted indanone as the end groups.

Wang et al, "Fused Hexacyclic Nonfullerene Acceptor with Strong Near-Infrared Absorption for Semitransparent Organic Solar Cells with 9.77% Efficiency" discloses solar cells containing acceptor IHIC, based on electron-donating group dithienocyclopentathieno[3,2-h]thiophene flanked by electron-withdrawing group 1,1-dicyanomethylene-3-indanone.

SUMMARY

A summary of aspects of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects and/or a combination of aspects that may not be set forth.

Embodiments of the present disclosure provide a composition comprising an electron donor, a fullerene electron acceptor and a non-fullerene electron acceptor wherein the non-fullerene electron acceptor is a compound of formula (I):

EAG—EDG—EAG (I)

wherein each EAG is an electron accepting group; and EDG is an electron-donating group of formula (II) or (III):

(II)

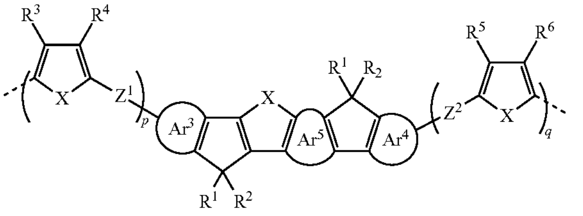

(III)

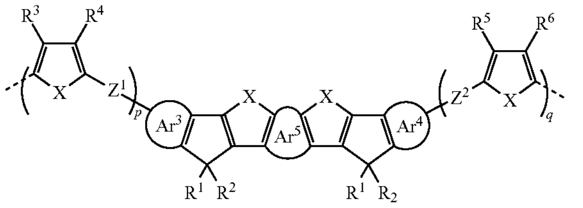

each X is independently O or S;

$Ar^3$ and $Ar^4$ interpedently in each occurrence is a monocyclic or polycyclic aromatic or heteroaromatic group;

$Ar^5$ is selected from the group consisting of thiophene, furan and benzene which is unsubstituted or substituted with one or two substituents;

$R^1$ and $R^2$ independently in each occurrence is a substituent;

$R^4$ and $R^5$ are each independently H or a substituent;

$R^3$ and $R^6$ are each independently H, a substituent or a divalent group bound to EAG;

$Z^1$ is a direct bond or $Z^1$ together with the substituent $R^4$ forms $Ar^1$ wherein $Ar^1$ is a monocyclic or polycyclic aromatic or heteroaromatic group;

$Z^2$ is a direct bond or $Z^2$ together with the substituent $R^5$ forms $Ar^2$ wherein $Ar^2$ is a monocyclic or polycyclic aromatic or heteroaromatic group;

p is 1, 2 or 3;

q is 1, 2 or 3; and

---- is a point of attachment to EAG.

In some embodiments, there is provided an organic photodetector comprising: an anode; a cathode; and a photosensitive organic layer disposed between the anode and cathode wherein the photosensitive organic layer comprises a composition as described herein.

In some embodiments, there is provided a circuit comprising an organic photodetector as described herein, and at least one of a voltage source for applying a reverse bias to the organic photodetector and a device configured to measure photocurrent generated by the photodetector.

In some embodiments, there is provided a formulation comprising the composition as described herein dissolved or dispersed in one or more solvents.

In some embodiments, there is provided a method of forming an organic photodetector as described herein comprising formation of the photosensitive organic layer over one of the anode and cathode and formation of the other of the anode and cathode over the photosensitive organic layer.

The present inventors have found that compounds of formula (I) may be capable of absorbing light at long wavelengths, e.g. greater than 750 nm, optionally greater than 1000 nm, optionally less than 1500 nm, allowing for use of these compounds in organic photodetectors, particularly in a photosensor containing such an OPD and a near infrared light source.

Accordingly, in some embodiments there is provided a photosensor comprising a light source and an organic photodetector as described herein configured to detect light emitted from the light source.

In some embodiments, there is provided a method of determining the presence and/or concentration of a target material in a sample, the method comprising illuminating the sample and measuring a response of an organic photodetector as described herein which is configured to receive light emitted from the sample upon illumination.

DESCRIPTION OF DRAWINGS

The disclosed technology and accompanying figures describe some implementations of the disclosed technology.

Figure 1:
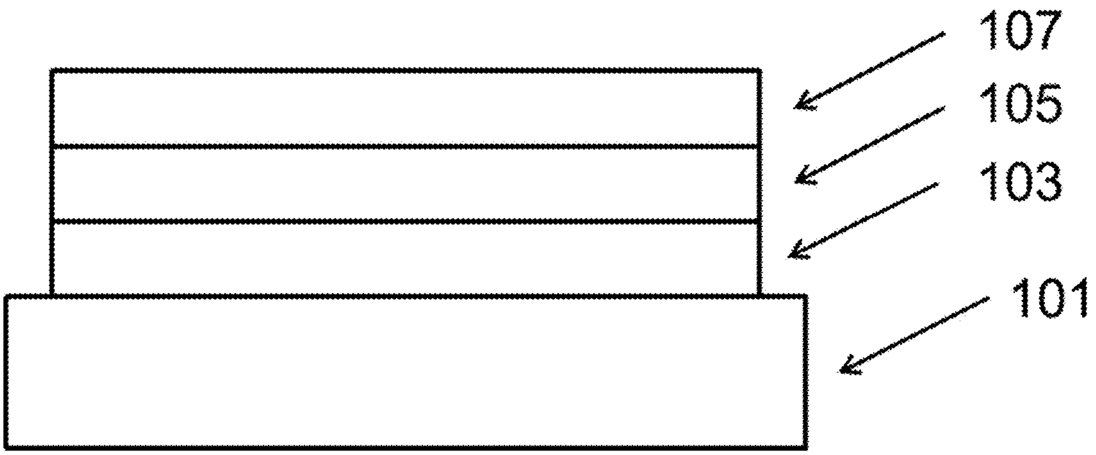
FIG. 1 illustrates an organic photodetector according to an embodiment of the invention.

The drawings are not drawn to scale and have various viewpoints and perspectives. The drawings are some implementations and examples. Additionally, some components and/or operations may be separated into different blocks or combined into a single block for the purposes of discussion of some of the embodiments of the disclosed technology. Moreover, while the technology is amenable to various modifications and alternative forms, specific embodiments have been shown by way of example in the drawings and are described in detail below. The intention, however, is not to limit the technology to the particular implementations described. On the contrary, the technology is intended to cover all modifications, equivalents, and alternatives falling within the scope of the technology as defined by the appended claims.

DETAILED DESCRIPTION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, electromagnetic, or a combination thereof. Additionally, the words "herein," "above," "below," and words of similar import, when used in this application, refer to this application as a whole and not to any particular portions of this application. Where the context permits, words in the Detailed Description using the singular or plural number may also include the plural or singular number respectively. The word "or," in reference to a list of two or more items, covers all of the following interpretations of the word: any of the items in the list, all of the items in the list, and any combination of the items in the list.

The teachings of the technology provided herein can be applied to other systems, not necessarily the system described below. The elements and acts of the various examples described below can be combined to provide further implementations of the technology. Some alternative implementations of the technology may include not only additional elements to those implementations noted below, but also may include fewer elements.

These and other changes can be made to the technology in light of the following detailed description. While the description describes certain examples of the technology, and describes the best mode contemplated, no matter how detailed the description appears, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the Detailed Description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms. For example, while some aspect of the technology may be recited as a computer-readable medium claim, other aspects may likewise be embodied as a computer-readable medium claim, or in other forms, such as being embodied in a means-plus-function claim.

In the following description, for the purposes of explanation, numerous specific details are set forth in order to provide a thorough understanding of implementations of the disclosed technology. It will be apparent, however, to one skilled in the art that embodiments of the disclosed technology may be practiced without some of these specific details.

FIG. 1 illustrates an OPD according to some embodiments of the present disclosure. The OPD comprises a cathode 103, an anode 107 and a bulk heterojunction layer 105 disposed between the anode and the cathode. The OPD may be supported on a substrate 101, optionally a glass or plastic substrate.

FIG. 1 illustrates an arrangement in which the cathode is disposed between the substrate and the anode. In other embodiments, the anode may be disposed between the cathode and the substrate.

The bulk heterojunction layer comprises a mixture of an electron acceptor and an electron donor. In some embodiments, the bulk heterojunction layer consists of the electron acceptor and the electron donor. In some embodiments, the bulk heterojunction layer comprises a further electron acceptor other than the electron acceptor of formula (I). Optionally, the further electron acceptor is a fullerene.

Each of the anode and cathode may independently be a single conductive layer or may comprise a plurality of layers.

The OPD may comprise layers other than the anode, cathode and bulk shown in FIG. 1. In some embodiments, a hole-transporting layer is disposed between the anode and the bulk heterojunction layer. In some embodiments, an electron-transporting layer is disposed between the cathode and the bulk heterojunction layer. In some embodiments, a work function modification layer is disposed between the bulk heterojunction layer and the anode, and/or between the bulk heterojunction layer and the cathode.

In use, the photodetectors as described in this disclosure may be connected to a voltage source for applying a reverse bias to the device and/or a device configured to measure photocurrent. The voltage applied to the photodetectors may be variable. In some embodiments, the photodetector may be continuously biased when in use.

In some embodiments, a photodetector system comprises a plurality of photodetectors as described herein, such as an image sensor of a camera.

In some embodiments, a sensor may comprise an OPD as described herein and a light source wherein the OPD is configured to receive light emitted from the light source.

In some embodiments, the light from the light source may or may not be changed before reaching the OPD. For example, the light may be filtered, down-converted or up-converted before it reaches the OPD.

In some embodiments, the light source has a peak wavelength of greater than 750 nm, optionally less than 1500 nm.

The bulk heterojunction layer may contain an electron acceptor (n-type) compound of formula (I):

EAG—EDG—EAG (I)

wherein each EAG is an electron accepting group; and EDG is an electron-donating group of formula (II) or (III):

(II)

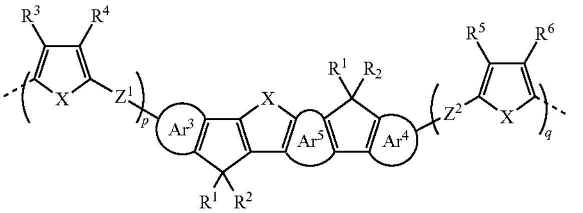

(III)

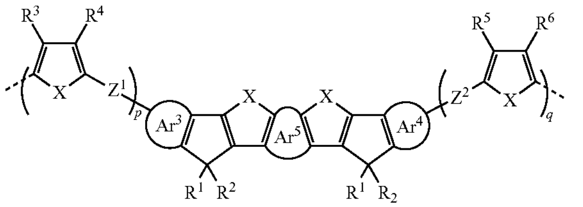

wherein:

each X is independently O or S;

$Ar^3$ and $Ar^4$ independently in each occurrence is a monocyclic or polycyclic aromatic or heteroaromatic group;

$Ar^5$ is selected from the group consisting of thiophene, furan and benzene which is unsubstituted or substituted with one or two substituents;

$R^1$ and $R^2$ independently in each occurrence is a substituent;

$R^4$ and $R^5$ are each independently H or a substituent;

$R^3$ and $R^6$ are each independently H, a substituent or a divalent group bound to EAG;

$Z^1$ is a direct bond or $Z^1$ together with the substituent $R^4$ forms $Ar^1$ wherein $Ar^1$ is a monocyclic or polycyclic aromatic or heteroaromatic group;

$Z^2$ is a direct bond or $Z^2$ together with the substituent $R^5$ forms $Ar^2$ wherein $Ar^2$ is a monocyclic or polycyclic aromatic or heteroaromatic group;

p is 1, 2 or 3;

q is 1, 2 or 3; and

---- is a point of attachment to EAG.

Optionally, $R^1$ and $R^2$ of formula (Ia) or (Ib) independently in each occurrence are selected from the group consisting of:

linear, branched or cyclic $C_{1-20}$ alkyl wherein one or more non-adjacent, non-terminal C atoms may be replaced by O, S, $NR^{12}$, CO or COO wherein $R^{12}$ is a $C_{1-12}$hydrocarbyl and one or more H atoms of the $C_{1-20}$ alkyl may be replaced with F; and a group of formula $(Ak)u\text{-}(Ar^6)v$ wherein Ak is a $C_{1-12}$ alkylene chain in which one or more C atoms may be replaced with O, S, CO or COO; u is 0 or 1; $Ar^6$ in each occurrence is independently an aromatic or heteroaromatic group which is unsubstituted or substituted with one or more substituents; and v is at least 1, optionally 1, 2 or 3.

$C_{1-12}$ hydrocarbyl may be $C_{1-12}$ alkyl; unsubstituted phenyl; and phenyl substituted with one or more $C_{1-6}$ alkyl groups.

$Ar^6$ is preferably phenyl.

Where present, substituents of $Ar^6$ may be a substituent $R^{16}$ wherein $R^{16}$ in each occurrence is independently selected from $C_{1-20}$ alkyl wherein one or more non-adjacent, non-terminal C atoms may be replaced by O, S, $NR^{12}$, CO or COO and one or more H atoms of the $C_{1-20}$ alkyl may be replaced with F.

If v is 3 or more then —$(Ar^6)v$ may be a linear or branched chain of $Ar^6$ groups. A linear chain of Ar groups as described herein has only on monovalent terminal $Ar^6$ group whereas a branched chain of $Ar^6$ groups has at least two monovalent terminal $Ar^6$ groups.

Optionally, at least one of $R^1$ and $R^2$ in each occurrence is phenyl which is unsubstituted or substituted with one or more substituents selected from $R^{16}$ as described above.

Optionally, each $R^3$-$R^6$ is independently selected from:

H;

$C_{1-12}$ alkyl wherein one or more non-adjacent, non-terminal C atoms may be replaced with O, S, COO or CO; and an aromatic or heteroaromatic group $Ar^6$ which is unsubstituted or substituted with one or more substituents.

$Ar^6$ is preferably an aromatic group, more preferably phenyl.

(IIa)

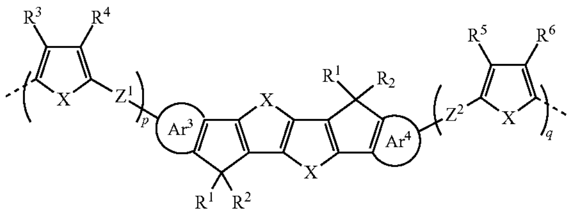

(IIIa)

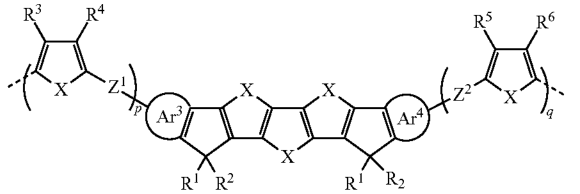

Optionally, EDG is selected from formulae (IIb) and (IIIb):

(IIb)

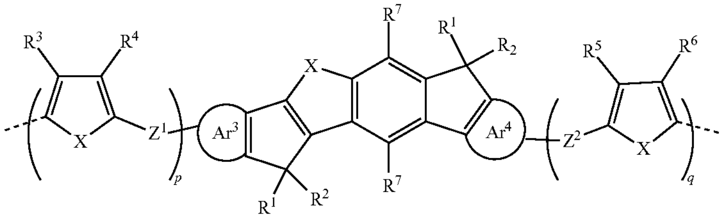

(IIIb)

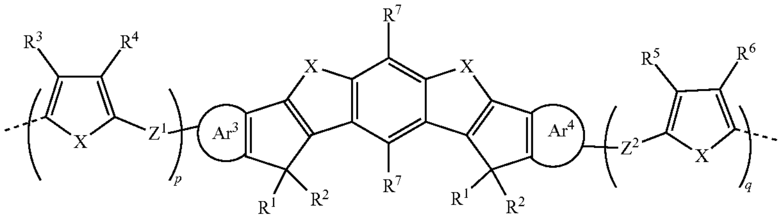

The one or more substituents of $Ar^6$, if present, may be selected from $C_{1-12}$ alkyl wherein one or more non-adjacent, non-terminal C atoms may be replaced with O, S, COO or CO.

By "non-terminal" C atom of an alkyl group as used herein is meant a C atom of the alkyl other than the methyl C atom of a linear (n-alkyl) chain or the methyl C atoms of a branched alkyl chain.

Optionally, $Ar^3$ and $Ar^4$ are each independently selected from thiophene, furan, bifuran and thienothiophene.

$Ar^3$, $Ar^4$ and $Ar^5$ are each independently unsubstituted or substituted with one or more substituents. Preferred substituents of $Ar^3$, $Ar^4$ and $Ar^5$, if present, are selected from groups $R^3$-$R^6$ described above other than H, preferably $C_{1-20}$ alkyl wherein one or more non-adjacent, non-terminal C atoms are replaced with O, S, CO or COO.

Optionally, EDG is selected from formulae (IIa) and (IIIa):

wherein $R^7$ in each occurrence is independently H or a substituent.

Optionally, $R^7$ in each occurrence is independently selected from:

H;

$C_{1-12}$ alkyl wherein one or more non-adjacent, non-terminal C atoms may be replaced with O, S, COO or CO; and an aromatic or heteroaromatic group $Ar^6$ which is unsubstituted or substituted with one or more substituents.

In some embodiments, each $R^3$-$R^6$ and, if present, $R^7$ is H; $C_{1-20}$ alkyl; or $C_{1-20}$ alkoxy.

In some embodiments at least one of, optionally both of, $R^4$ and $R^5$ is not H, and each $R^3$, $R^6$ and, if present, $R^7$ is H.

Optionally, at least one of p and q is 2.

Optionally, $Z^1$ is linked to $R^4$ to form a monocyclic aromatic or heteroaromatic group and/or $Z^2$ is linked to $R^5$ to form a monocyclic aromatic or heteroaromatic group.

Optionally, $Z^1$ is linked to $R^4$ to form a thiophene ring or furan ring and/or $Z^2$ is linked to $R^5$ to form a thiophene ring or furan ring.

Each EAG has a LUMO level that is deeper (i.e. further from vacuum) than that of EDG, preferably at least 1 eV deeper. The LUMO levels of EAG and EDG may be as determined by modelling the LUMO level of EAG-H with that of H-EDG-H, i.e. by replacing the bonds between EAG and EDG with bonds to a hydrogen atom. Modelling may be performed using Gaussian09 software available from Gaussian using Gaussian09 with B3LYP (functional) and LACVP* (Basis set).

Optionally, each EAG is a group of formula (IV) or (V):

(IV)

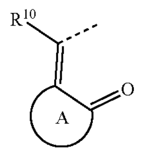

(V)

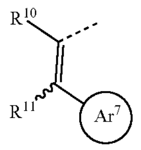

Wherein A is a 5- or 6-membered ring which is unsubstituted or substituted with one or more substituents; $R^{10}$ and $R^{11}$ independently in each occurrence is a substituent; and $Ar^7$ is an aromatic or heteroaromatic group which is unsubstituted or substituted with one or more substituents.

Optionally, each EAG is a group of formula (VI):

(VI)

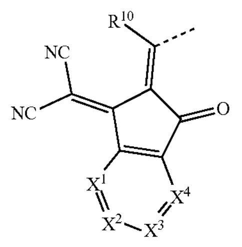

wherein:

$R^{10}$ in each occurrence is H or a substituent;

---- represents a linking position to EDG; and each $X^1$—$X^4$ is independently $CR^{13}$ or N wherein $R^{13}$ in each occurrence is H or a substituent.

Optionally, each $R^{13}$ is independently selected from H; $C_{1-12}$ alkyl; and an electron withdrawing group. Optionally, the electron withdrawing group is F or CN.

$R^{10}$ is preferably H.

Substituents $R^{10}$ are preferably selected from the group consisting of $C_{1-12}$ alkyl wherein one or more non-adjacent, non-terminal C atoms may be replaced with O, S, COO or CO and one or more H atoms of the alkyl may be replaced with F; and an aromatic group $Ar^9$, optionally phenyl, which is unsubstituted or substituted with one or more substituents selected from F and $C_{1-12}$ alkyl wherein one or more non-adjacent, non-terminal C atoms may be replaced with O, S, COO or CO.

Optionally, $R^3$ and/or $R^6$ is $B(R^{14})_2$ wherein $R^{14}$ in each occurrence is a substituent, optionally a $C_{1-20}$ hydrocarbyl group, and one or both EAG groups is an unsubstituted or substituted heteroaromatic group of formula (VII):

(VII)

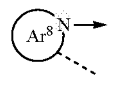

wherein $Ar^8$ is a monocyclic or fused heteroaromatic group which is unsubstituted or substituted with one or more substituents; → is a bond to the boron atom of $R^3$ or $R^6$; and --- is the bond to EDG.

The, or each, substituent of $Ar^8$ (if present) may be selected from substituents described with reference to $R^7$.

Optionally, $R^{14}$ is a $C_{1-20}$hydrocarbyl group $R^{14}$ is selected from $C_{1-12}$ alkyl; unsubstituted phenyl; and phenyl substituted with one or more $C_{1-12}$ alkyl groups.

Optionally, the group of formula (VII) is selected from formulae (VIIa), (VIIb) and (VIIc):

(VIIa)

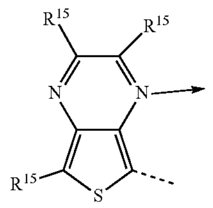

(VIIb)

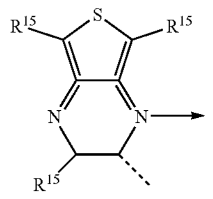

(VIIc)

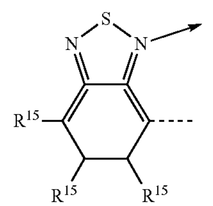

wherein $R^{15}$ in each occurrence is independently H or a substituent, optionally H or a substituent as described with reference to $R^7$. EDG, EAG and the $B(R^{14})_2$ substituent of EDG may be linked together to form a 5- or 6-membered ring.

Optionally, EAG is selected from formulae (XIV)-(XXV):

(IXVa)

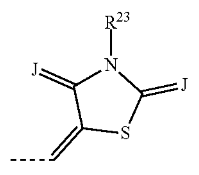

-continued (IXVb)

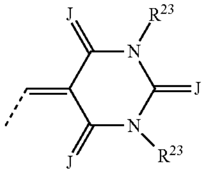

(XVa)

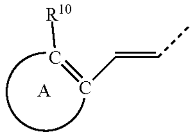

(XVb)

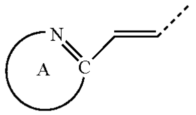

(XVIa)

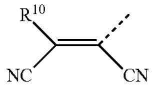

(XVIb)

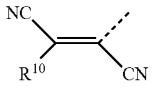

(XVIc)

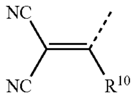

(XVII)

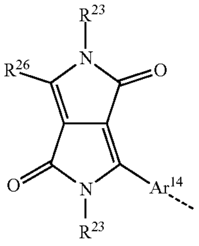

(XVIII)

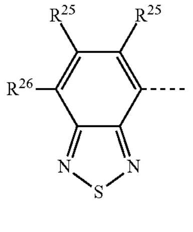

(XIX)

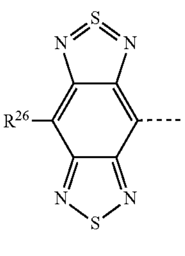

-continued (XX)

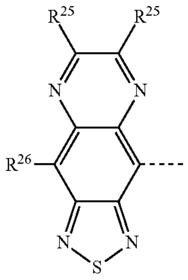

(XXI)

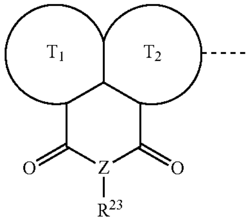

(XXII)

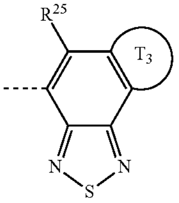

(XXIV)

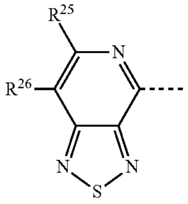

(XXV)

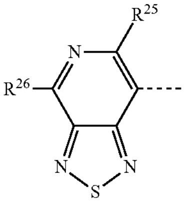

J is O or S.

A is a 5- or 6-membered ring which is unsubstituted or substituted with one or more substituents and which may be fused to one or more further rings.

$R^{23}$ in each occurrence is a substituent, optionally $C_{1-12}$ alkyl wherein one or more non-adjacent, non-terminal C atoms may be replaced with O, S, COO or CO and one or more H atoms of the alkyl may be replaced with F.

$R^{25}$ in each occurrence is independently H; F; $C_{1-12}$ alkyl wherein one or more non-adjacent, non-terminal C atoms may be replaced with O, S, COO or CO and one or more H atoms of the alkyl may be replaced with F; or an aromatic group $Ar^2$, optionally phenyl, which is unsubstituted or substituted with one or more substituents selected from F and $C_{1-12}$ alkyl wherein one or more non-adjacent, non-terminal C atoms may be replaced with O, S, COO or CO.

$R^{26}$ is a substituent, preferably a substituent selected from:

—$(Ar^{13})_w$— wherein $Ar^{13}$ in each occurrence is independently an unsubstituted or substituted aryl or heteroaryl group, preferably thiophene, and w is 1, 2 or 3;

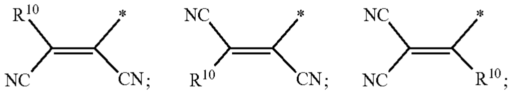

and $C_{1-12}$ alkyl wherein one or more non-adjacent, non-terminal C atoms may be replaced with O, S, COO or CO and one or more H atoms of the alkyl may be replaced with F.

$Ar^{14}$ is a 5-membered heteroaromatic group, preferably thiophene or furan, which is unsubstituted or substituted with one or more substituents.

Substituents of $Ar^{13}$ and $Ar^{14}$, where present, are optionally selected from $C_{1-12}$ alkyl wherein one or more non-adjacent, non-terminal C atoms may be replaced with O, S, COO or CO and one or more H atoms of the alkyl may be replaced with F.

$Z^1$ is N or P $T^1$, $T^2$ and $T^3$ each independently represent an aryl or a heteroaryl ring which may be fused to one or more further rings. Substituents of $T^1$, $T^2$ and $T^3$, where present, are optionally selected from non-H groups of $R^1$.

Exemplary compounds of formula (XIVa) or (XIVb) include:

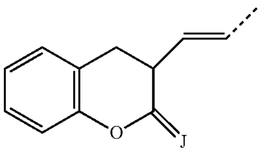

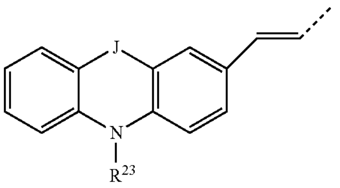

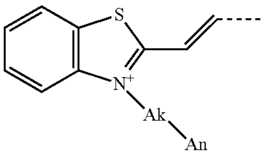

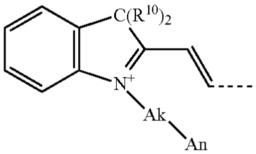

-continued

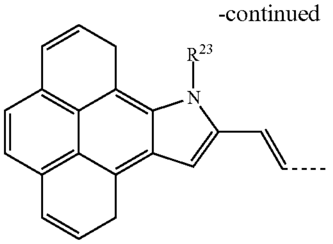

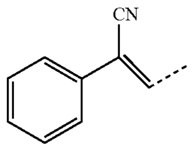

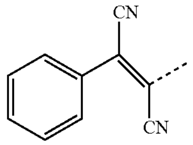

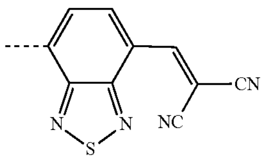

wherein Ak is a $C_{1-12}$ alkylene chain in which one or more C atoms may be replaced with O, S, CO or COO; An is an anion, optionally —$SO_3$—; and each benzene ring is independently unsubstitued or substituted with one or more substituents selected from substituents described with reference to $R^{10}$.

Exemplary EAGs of formula (XXI) are:

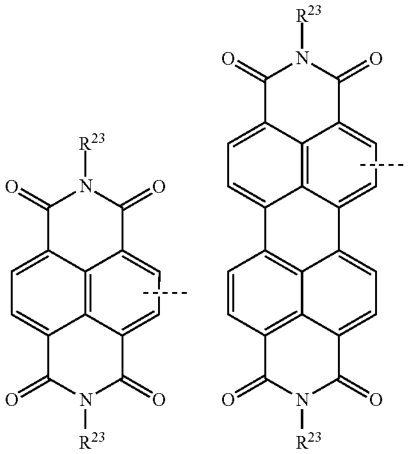

An exemplary EAG group of formula (XXII) is:

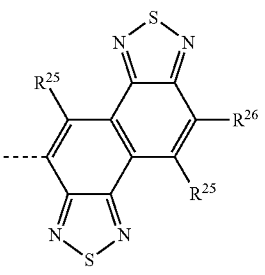

Exemplary compounds of formula (I) are:
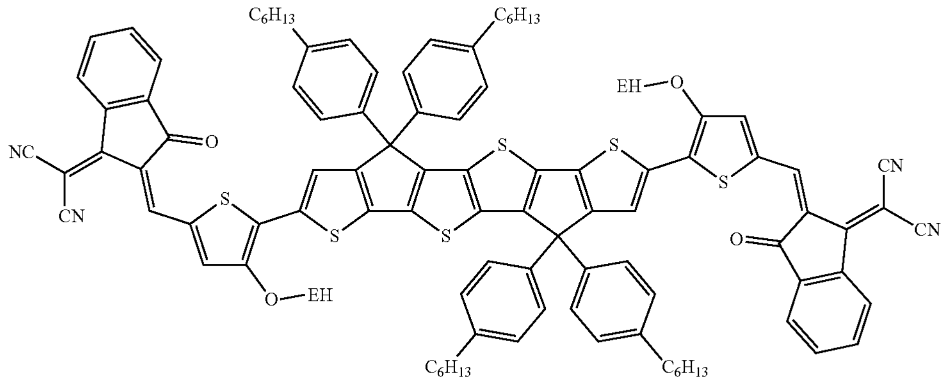
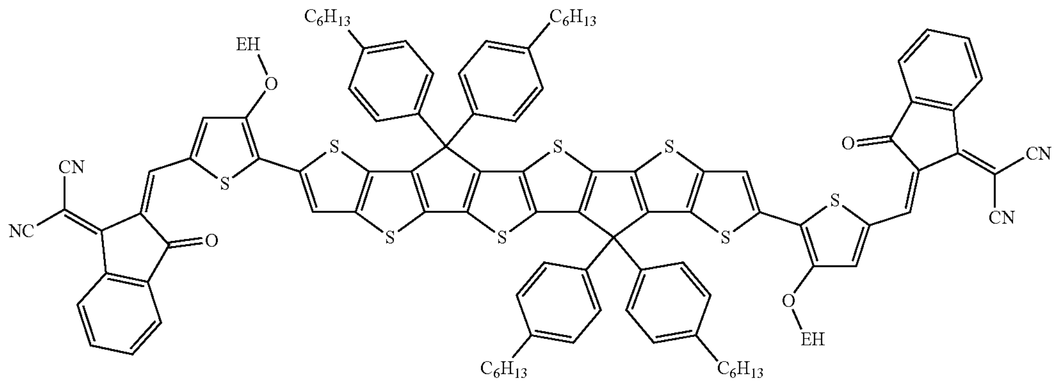
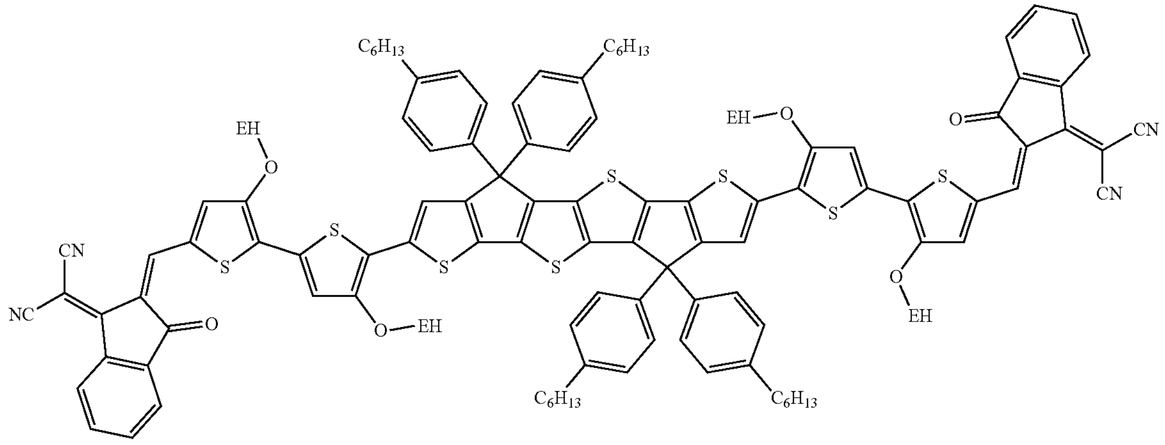

-continued

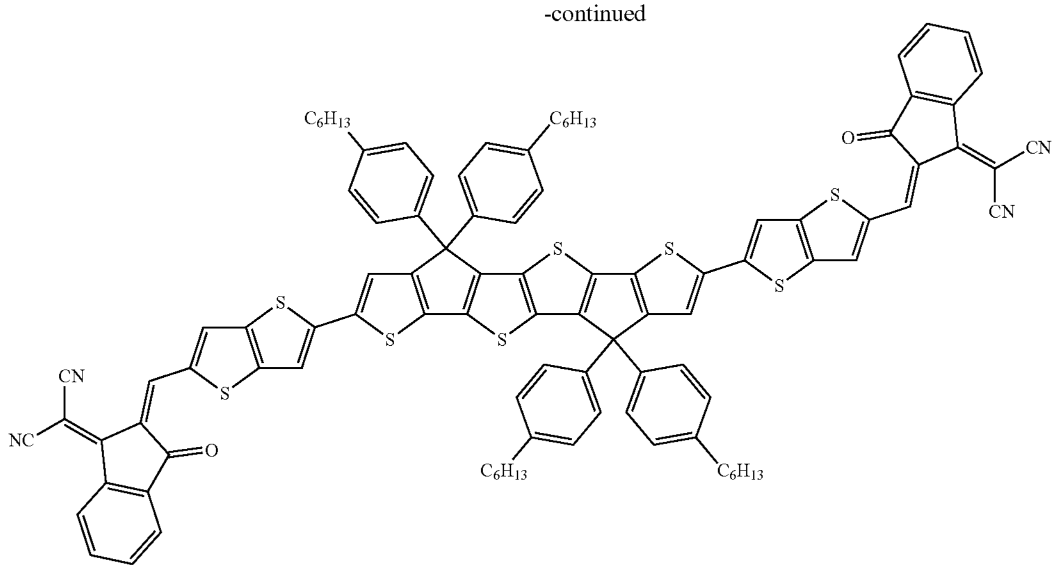

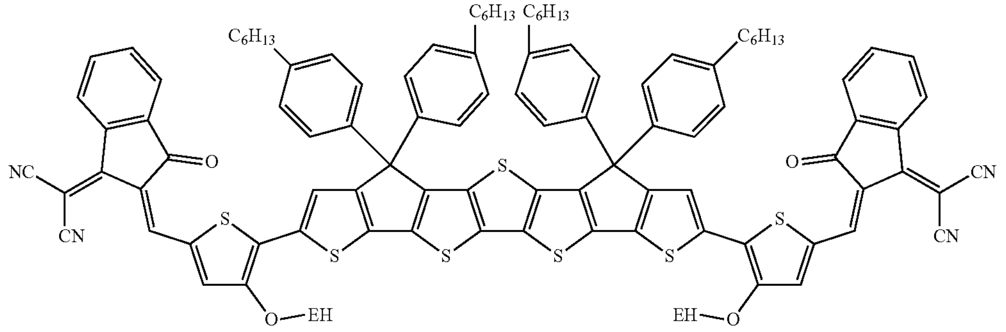

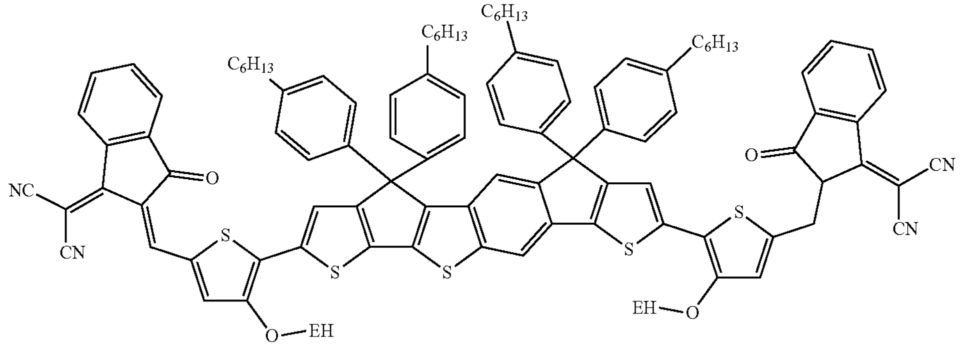

wherein EH is ethylhexyl.

The compound of formula (I) may be used in combination with a fullerene acceptor.

The compound of formula (I): fullerene acceptor weight ratio may be in the range of about 1:0.1-1:1, preferably in the range of about 1:0.1-1:0.5.

The fullerene may be a $C_{60}$, $C_{70}$, $C_{76}$, $C_{78}$ or $C_{84}$ fullerene or a derivative thereof including, without limitation, PCBM-type fullerene derivatives (including phenyl-$C_{61}$-butyric acid methyl ester ($C_{60}$PCBM) and phenyl-$C_{71}$-butyric acid methyl ester ($C_{70}$PCBM)), TCBM-type fullerene derivatives (e.g. tolyl-C61-butyric acid methyl ester ($C_{60}$TCBM)), and ThCBM-type fullerene derivatives (e.g. thienyl-C61-butyric acid methyl ester ($C_{60}$ThCBM)

Where present, a fullerene acceptor may have formula (VIII):

(VIII)

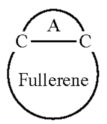

wherein A, together with the C—C group of the fullerene, forms a monocyclic or fused ring group which may be unsubstituted or substituted with one or more substituents.

Exemplary fullerene derivatives include formulae (IIIa), (IIIb) and (IIIc):

(VIIIa)

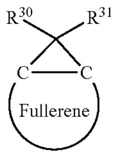

(VIIIb)

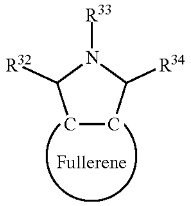

(VIIIc)

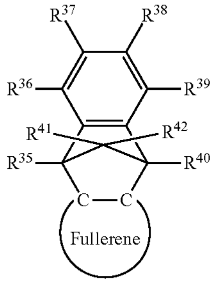

wherein $R^{30}$-$R^{42}$ are each independently H or a substituent.

Substituents $R^{30}$-$R^{42}$ are optionally and independently in each occurrence selected from the group consisting of aryl or heteroaryl, optionally phenyl, which may be unsubstituted or substituted with one or more substituents; and $C_{1-20}$ alkyl wherein one or more non-adjacent, non-terminal C atoms may be replaced with O, S, CO or COO and one or more H atoms may be replaced with F.

An exemplary fullerene of formula (VIIIc) is $C_{60}$IPH.

Substituents of aryl or heteroaryl groups $R^{30}$-$R^{42}$, where present, are optionally selected from $C_{1-12}$ alkyl wherein one or more non-adjacent, non-terminal C atoms may be replaced with O, S, CO or COO and one or more H atoms may be replaced with F.

The donor (p-type) compound is not particularly limited and may be appropriately selected from electron donating materials that are known to the person skilled in the art, including organic polymers and non-polymeric organic molecules. The p-type compound has a HOMO deeper (further from vacuum) than a LUMO of the compound of formula (I). Optionally, the gap between the HOMO level of the p-type donor and the LUMO level of the n-type acceptor compound of formula (I) is less than 1.4 eV.

In a preferred embodiment the p-type donor compound is an organic conjugated polymer, which can be a homopolymer or copolymer including alternating, random or block copolymers. Preferred are non-crystalline or semi-crystalline conjugated organic polymers. Further preferably the p-type organic semiconductor is a conjugated organic polymer with a low bandgap, typically between 2.5 eV and 1.5 eV, preferably between 2.3 eV and 1.8 eV. As exemplary p-type donor polymers, polymers selected from conjugated hydrocarbon or heterocyclic polymers including polyacene, polyaniline, polyazulene, polybenzofuran, polyfluorene, polyfuran, polyindenofluorene, polyindole, polyphenylene, polypyrazoline, polypyrene, polypyridazine, polypyridine, polytriarylamine, poly(phenylene vinylene), poly(3-substituted thiophene), poly(3,4-bisubstituted thiophene), polyselenophene, poly(3-substituted selenophene), poly(3,4-bisubstituted selenophene), poly(bisthiophene), poly (terthiophene), poly(bisselenophene), poly(terselenophene), polythieno[2,3-b]thiophene, polythieno[3,2-b]thiophene, polybenzothiophene, polybenzo[1,2-b:4,5-b']dithiophene, polyisothianaphthene, poly(monosubstituted pyrrole), poly (3,4-bisubstituted pyrrole), poly-1,3,4-oxadiazoles, polyisothianaphthene, derivatives and co-polymers thereof may be mentioned. Preferred examples of p-type donors are copolymers of polyfluorenes and polythiophenes, each of which may be substituted, and polymers comprising benzothiadiazole-based and thiophene-based repeating units, each of which may be substituted. It is understood that the p-type donor may also consist of a mixture of a plurality of electron donating materials.

Optionally, the donor polymer comprises a repeat unit of formula (XXX):

(XXX)

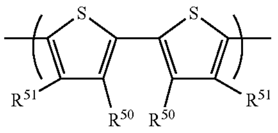

wherein $R^{50}$ and $R^{51}$ independently in each occurrence is H or a substituent.

Substituents $R^{50}$ and $R^{51}$ may be selected from groups other than H described with respect to $R^7$.

Preferably, each $R^{50}$ is a substituent. In a preferred embodiment, the $R^{50}$ groups are linked to form a group of formula —$Y^1$—$C(R^{52})_2$— wherein $Y^1$ is O, $NR^{53}$, or $C(R^{52})_2$; $R^{52}$ in each occurrence is H or a substituent, preferably a substituent as described with reference to $R^1$, most preferably a $C_{1-30}$ hydrocarbyl group; and $R^{53}$ is a substituent, preferably a $C_{1-30}$ hydrocarbyl group.

Preferably, each $R^{51}$ is H.

Optionally, the donor polymer comprises a repeat unit selected from repeat units of formulae:

(XVIIIa)

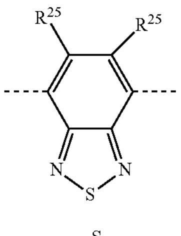

(XIXa)

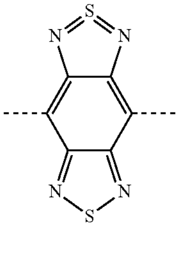

-continued (XXa)

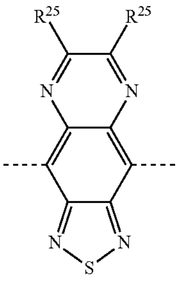

(XXIa)

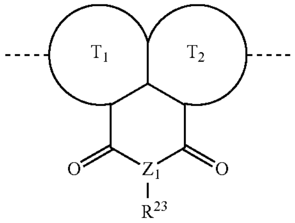

(XXIIa)

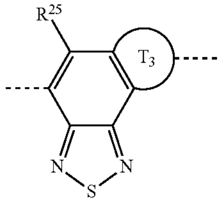

(XXIVa)

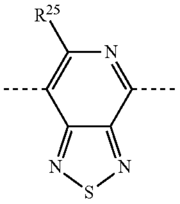

(XXVa)

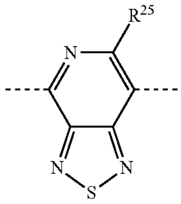

(XXVIa)

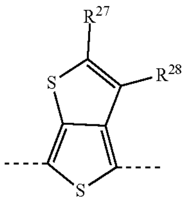

(XXVIIa)

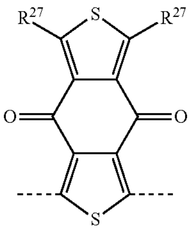

-continued (XXVIIIa)

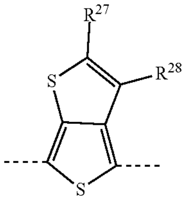

(XXIXa)

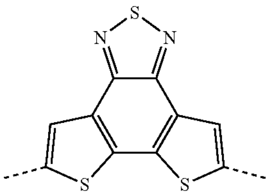

(XXXa)

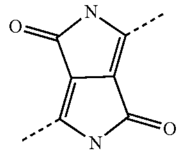

wherein $R^{25}$, $Z^1$, $R^{23}$ and $R^{25}$ are as described above and wherein $R^{27}$ and $R^{28}$ are each independently selected from H or a substituent, more preferably an electron withdrawing substituent. Exemplary electron-withdrawing substituents are F; CN; $NO_2$; and $COOR^{29}$ wherein $R^{29}$ is a $C_{1-20}$ hydrocarbyl group, optionally a $C_{1-12}$ alkyl or phenyl which is optionally substituted with one or more $C_{1-12}$ alkyl groups.

In some embodiments, the donor is an alternating copolymer comprising alternating electron-donating repeat units and electron-accepting repeat units which are directly bound to one another.

In some embodiments, the donor comprises alternating electron-donating repeat units and electron-accepting repeat units which are separated from one another by bridging units. Preferred bridging units are optionally substituted monocyclic aromatic or heteroaromatic units, more preferably a 5-membered heteroaromatic unit comprising ring atoms selected from C and one or more of S, O and N, most preferably thiophene.

Substituents of a C atom of a bridging unit may be selected from non-H groups $R^{25}$ as described above. Substituents of a N atom of a bridging unit may be selected from groups $R^{23}$ as described above.

Exemplary donor materials are disclosed in, for example, WO2013/051676, the contents of which are incorporated herein by reference.

In some embodiments, formation of a conjugated polymer donors comprises polymerisation of a monomer of formula M-1 and a monomer of formula M-2:

LG1—A—LG1 M-1

LG2—D—LG2 M-2 wherein:

LG1 is a leaving group selected from one of: (a) a halogen or $—OSO_2R^8$ wherein $R^8$ is an optionally substituted $C_{1-12}$ alkyl or aryl and (b) a boronic acid or ester.

LG2 is the other of (a) and (b);

A is a group for forming an electron-accepting repeat unit; and

B is a group for forming an electron-donating repeat unit.

$R^8$ is preferably a $C_{1-12}$ alkyl or phenyl which is optionally substituted with one or more F atoms.

In other embodiments, M-1 is replaced with a monomer of formula M-1' or M-2 is replaced with a monomer of formula M-2', wherein B is a bridging group as described herein:

LG1—B—A—B—LG1 M-1'

LG2—B—D—B—LG2 M-2'

Exemplary groups formed by reaction of a monomer of formula M-1 include:

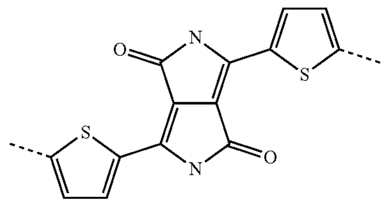

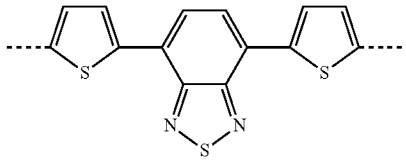

Optionally, the p-type donor has a HOMO level no more than 5.5 eV from vacuum level. Optionally, the p-type donor has a HOMO level at least 4.1 eV from vacuum level.

Unless stated otherwise, HOMO and LUMO levels of a compound as described herein are as measured from a film of the compound using square wave voltammetry.

In some embodiments, the weight of the donor compound to the acceptor compound is from about 1:0.5 to about 1:2.

Preferably, the weight ratio of the donor compound to the acceptor compound is about 1:1 or about 1:1.5.

At least one of the first and second electrodes is transparent so that light incident on the device may reach the bulk heterojunction layer. In some embodiments, both of the first and second electrodes are transparent.

Each transparent electrode preferably has a transmittance of at least 70%, optionally at least 80%, to wavelengths in the range of 300-900 nm.

In some embodiments, one electrode is transparent and the other electrode is reflective.

Optionally, the transparent electrode comprises or consists of a layer of transparent conducting oxide, preferably indium tin oxide or indium zinc oxide. In preferred embodiments, the electrode may comprise poly 3,4-ethylenedioxythiophene (PEDOT).

In other preferred embodiments, the electrode may comprise a mixture of PEDOT and polystyrene sulfonate (PSS). The electrode may consist of a layer of PEDOT:PSS.

Optionally, the reflective electrode may comprise a layer of a reflective metal. The layer of reflective material may be aluminium or silver or gold. In some embodiments, a bi-layer electrode may be used. For example, the electrode may be an indium tin oxide (ITO)/silver bi-layer, an ITO/aluminium bi-layer or an ITO/gold bi-layer.

The device may be formed by forming the bulk heterojunction layer over one of the anode and cathode supported by a substrate and depositing the other of the anode or cathode over the bulk heterojunction layer.

The area of the OPD may be less than about 3 $cm^2$, less than about 2 $cm^2$, less than about 1 $cm^2$, less than about 0.75 $cm^2$, less than about 0.5 $cm^2$ or less than about 0.25 $cm^2$. The substrate may be, without limitation, a glass or plastic substrate. The substrate can be described as an inorganic semiconductor. In some embodiments, the substrate may be silicon. For example, the substrate can be a wafer of silicon. The substrate is transparent if, in use, incident light is to be transmitted through the substrate and the electrode supported by the substrate.

The substrate supporting one of the anode and cathode may or may not be transparent if, in use, incident light is to be transmitted through the other of the anode and cathode.

The bulk heterojunction layer may be formed by any process including, without limitation, thermal evaporation and solution deposition methods.

Preferably, the bulk heterojunction layer is formed by depositing a formulation comprising the acceptor material and the electron donor material dissolved or dispersed in a solvent or a mixture of two or more solvents. The formulation may be deposited by any coating or printing method including, without limitation, spin-coating, dip-coating, roll-coating, spray coating, doctor blade coating, wire bar coating, slit coating, ink jet printing, screen printing, gravure printing and flexographic printing.

The one or more solvents of the formulation may optionally comprise or consist of benzene substituted with one or more substituents selected from chlorine, $C_{1-10}$ alkyl and $C_{1-10}$ alkoxy wherein two or more substituents may be linked to form a ring which may be unsubstituted or substituted with one or more $C_{1-6}$ alkyl groups, optionally toluene, xylenes, trimethylbenzenes, tetramethylbenzenes, anisole, indane and its alkyl-substituted derivatives, and tetralin and its alkyl-substituted derivatives.

The formulation may comprise a mixture of two or more solvents, preferably a mixture comprising at least one benzene substituted with one or more substituents as described above and one or more further solvents. The one or more further solvents may be selected from esters, optionally alkyl or aryl esters of alkyl or aryl carboxylic acids, optionally a $C_{1-10}$ alkyl benzoate, benzyl benzoate or dimethoxybenzene. In preferred embodiments, a mixture of trimethylbenzene and benzyl benzoate is used as the solvent. In other preferred embodiments, a mixture of trimethylbenzene and dimethoxybenzene is used as the solvent.

The formulation may comprise further components in addition to the electron acceptor, the electron donor and the one or more solvents. As examples of such components, adhesive agents, defoaming agents, deaerators, viscosity enhancers, diluents, auxiliaries, flow improvers colourants, dyes or pigments, sensitizers, stabilizers, nanoparticles, surface-active compounds, lubricating agents, wetting agents, dispersing agents and inhibitors may be mentioned.

The organic photodetector as described herein may be used in a wide range of applications including, without limitation, detecting the presence and/or brightness of ambient light and in a sensor comprising the organic photodetector and a light source. The photodetector may be configured such that light emitted from the light source is incident on the photodetector and changes in wavelength and/or brightness of the light may be detected, e.g. due to absorption by and/or emission of light from a target material in a sample disposed in a light path between the light source and the organic photodetector. The sensor may be, without limitation, a gas sensor, a biosensor, an X-ray imaging device, an image sensor such as a camera image sensor, a motion sensor (for example for use in security applications) a proximity sensor or a fingerprint sensor. A 1D or 2D photosensor array may comprise a plurality of photodetectors as described herein in an image sensor. The photodetector may be configured to detect light emitted from a target analyte which emits light upon irradiation by the light source or which is bound to a luminescent tag which emits light upon irradiation by the light source. The photodetector may be configured to detect a wavelength of light emitted by the target analyte or a luminescent tag bound thereto.

EXAMPLES

Synthesis

A compound may be prepared according to the following reaction scheme:

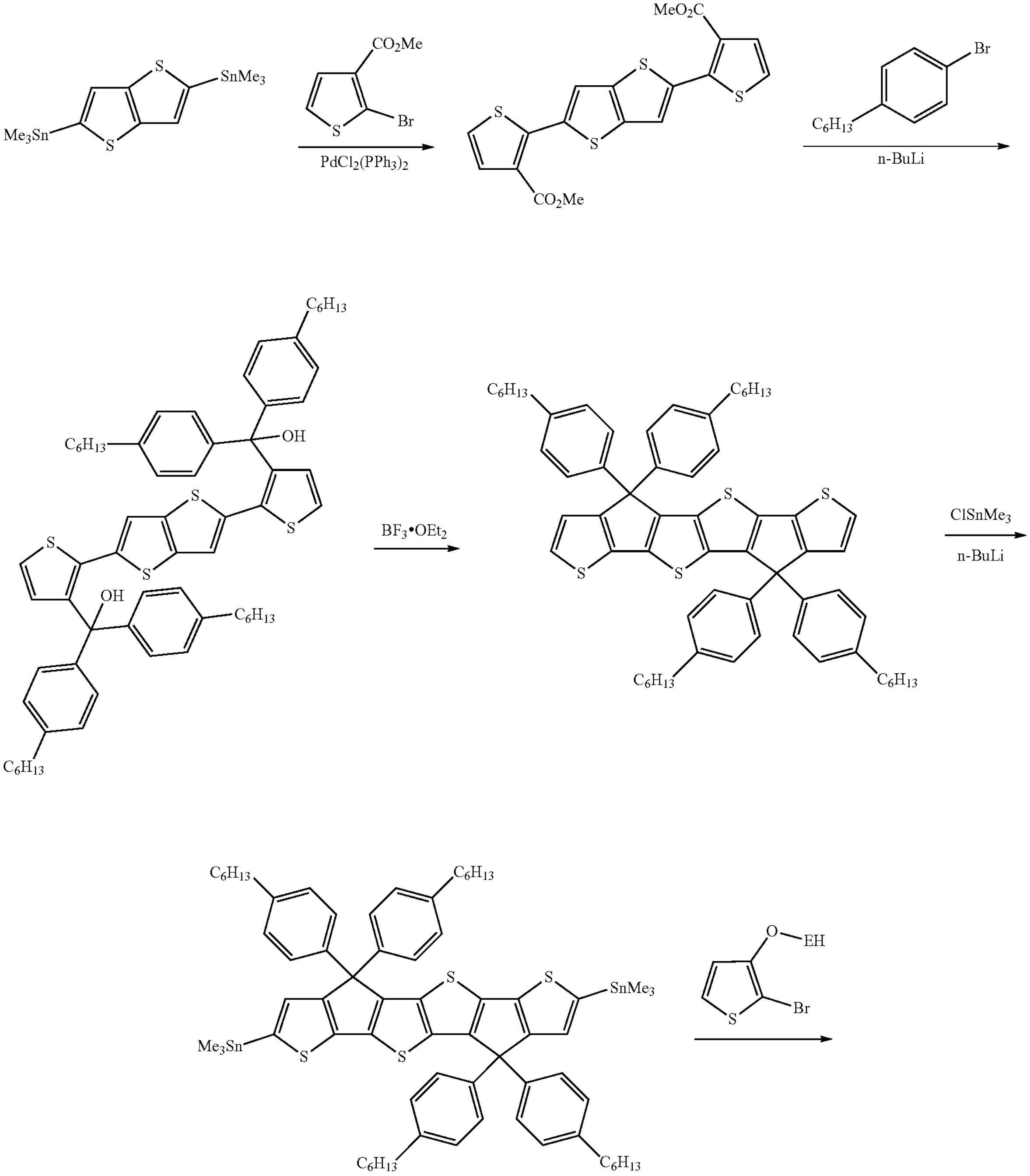

-continued
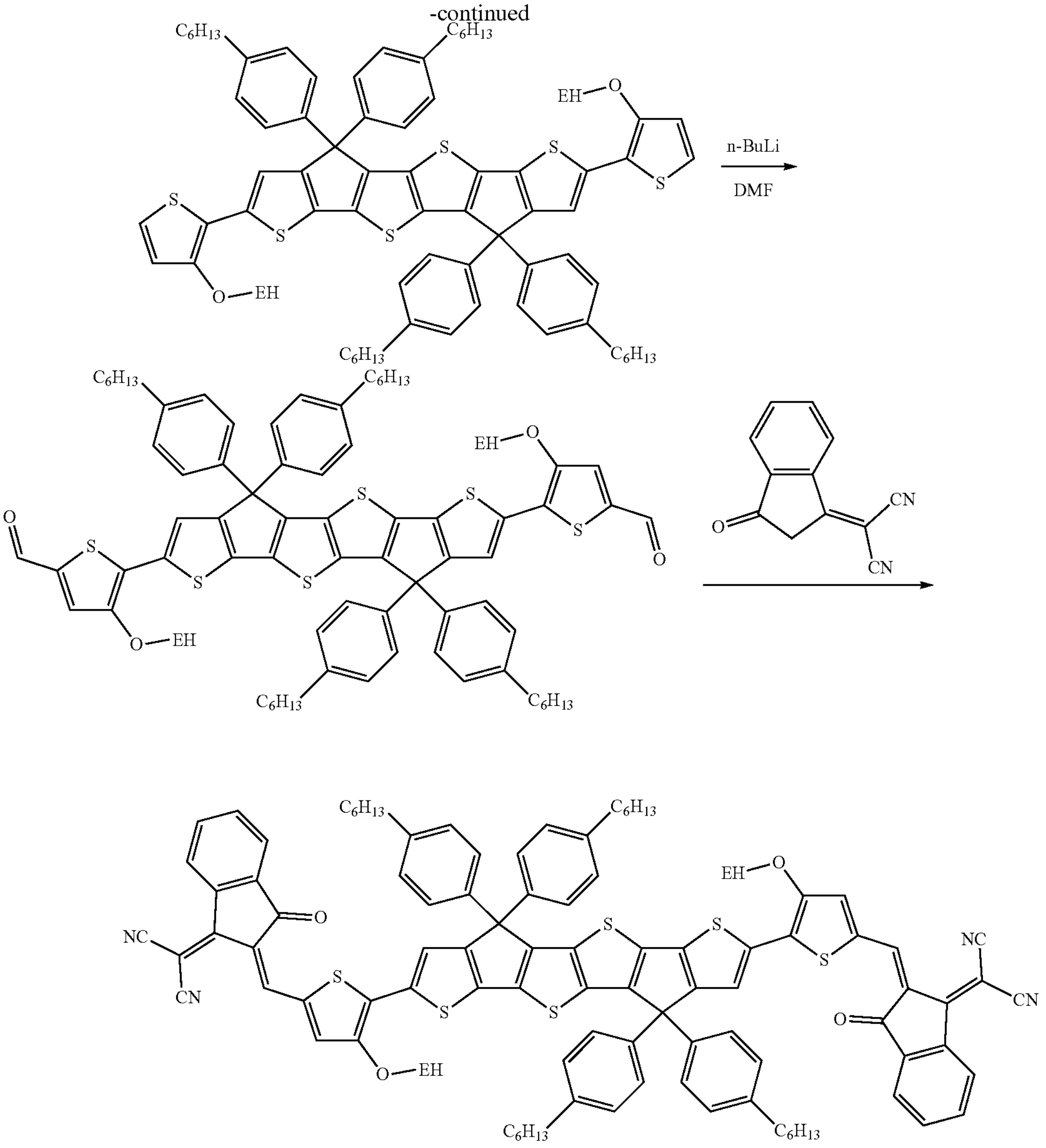
Compound Example 1 was prepared according to the following reaction scheme:
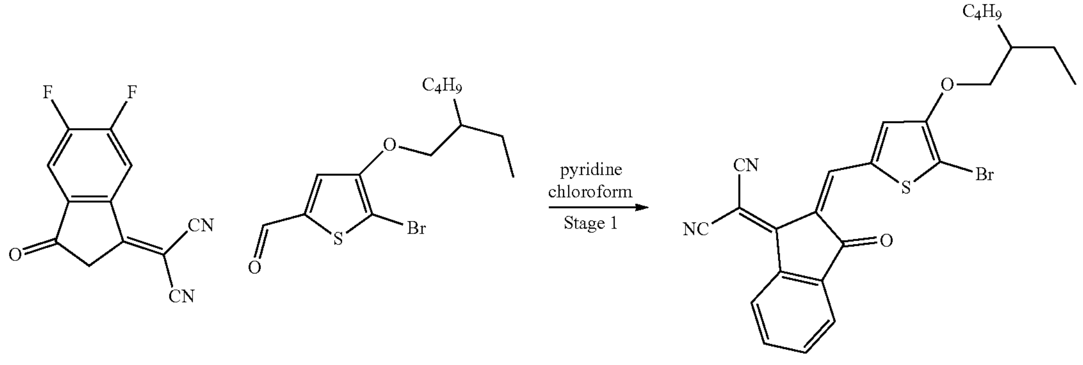
+

-continued

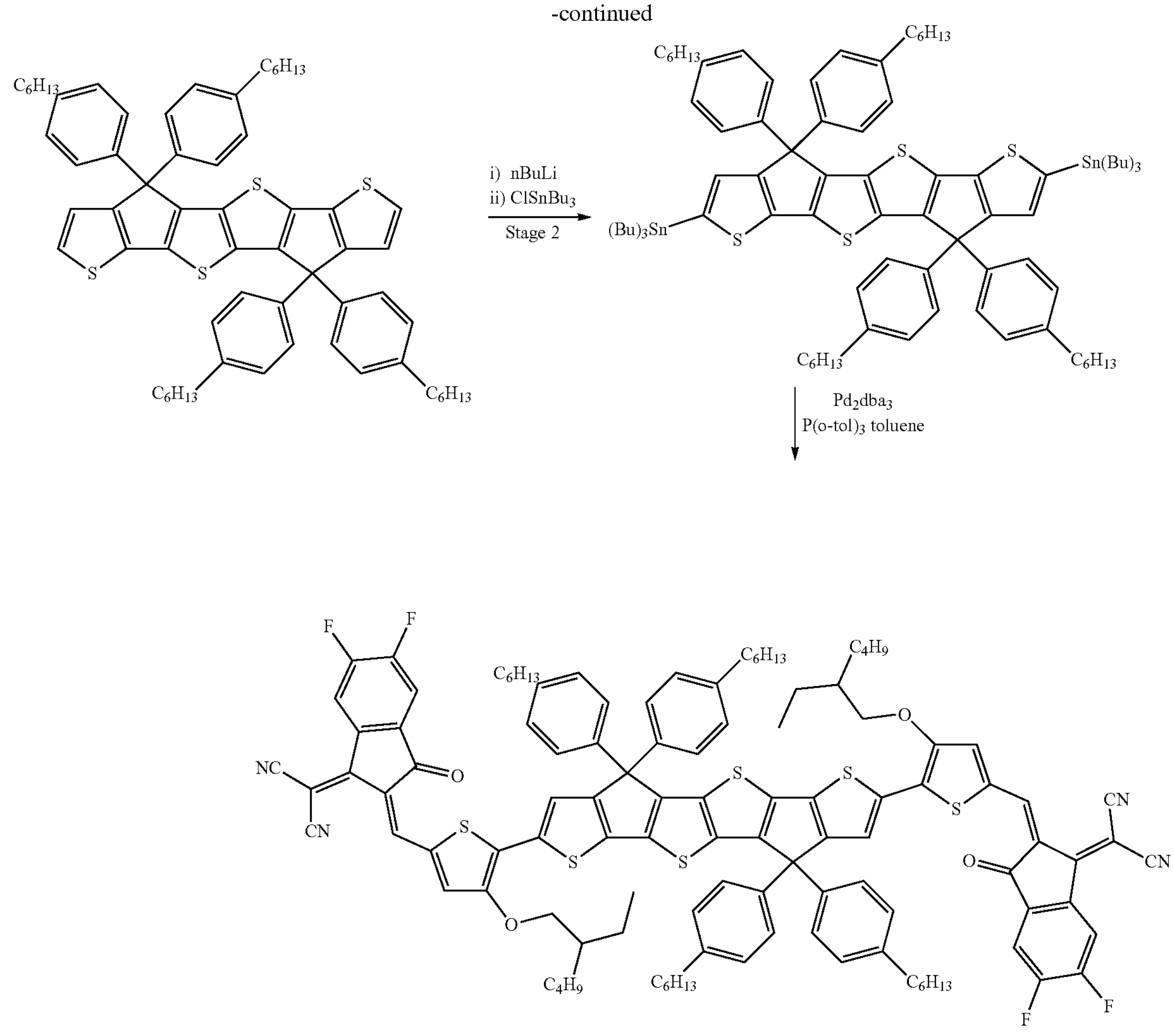

Compound Example 1

Stage 1

Aldehyde (3 g, 9.4 mmol) was dissolved in chloroform (30 mL) and pyridine (5 mL). The solution was degassed for 0.5 h and then cooled to 0° C. The difluoro unit (3.2 g, 15.5 mmol) was added and the reaction mixture degassed for a further 0.25 h and then allowed to warm to r.t. for 3 h. Methanol was added and the solvent removed to yield a red solid. This crude material was purified by column chromatography on silica eluting with petrol ether:DCM 9:1. The product-containing fractions were concentrated to yield the stage 1 material (3.5 g) with 98% purity.

Stage 2

The fused thiophene material (which can be made as described in *Macromolecular Rapid Communications*, 2011, 32, 1664 or Chem. Mater., 2017, 29, 8369) (1 g, 1.0 mmol) was dissolve in THF and cooled to −78° C. under nitrogen. N-Butyllithium (1.65 mL, 4.1 mmol) was added dropwise and the solution stirred for 1 h at −78° C. before tributyltin chloride (0.99 mg, 3.0 mmol) in THF (5 mL) was added dropwise. The reaction mixture was allowed to reach r.t. over 16 h. Methanol was added to quench the reaction and the solvents were removed. The crude material was triturated with methanol several times to yield to stage 2 material which was used in the next step without further purification.

Compound Example 1

Stage 1 material (1.3 g, 2.4 mmol) and stage 2 material (1.5 g, 0.97 mmol) was dissolved in toluene and degassed. Tri(o-tolyl)phosphine (88 mg, 0.3 mmol) and tris(dibenzylideneacetone) dipalladium (71 mg, 0.08 mmol) were added and the reaction mixture stirred at 80° C. for 5 h. The reaction mixture was cooled and passed through a celite plug which was further eluted with toluene. The filtrate was concentrated to yield a black semisolid which was triturated with methanol to obtain the crude product as a solid. This was purified by column chromatography on silica using DCM in hexane. The product-containing fractions were concentrated to give the product as a black solid (530 mg) with 97.8% purity.

Compound Example 2

Compound Example 2 was prepared according to the following reaction scheme:

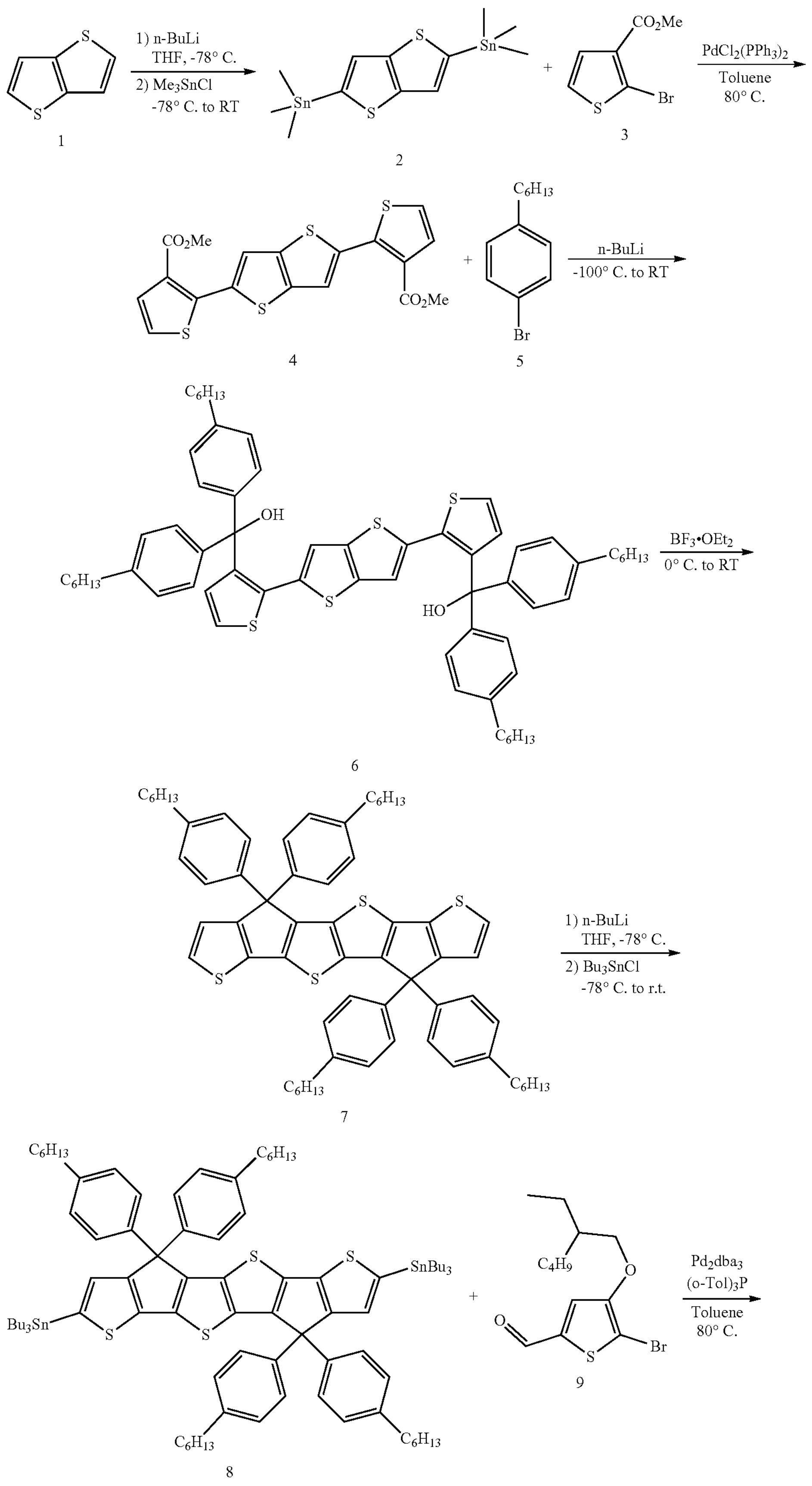
1 2 3 4 5 6 7 8 9

-continued

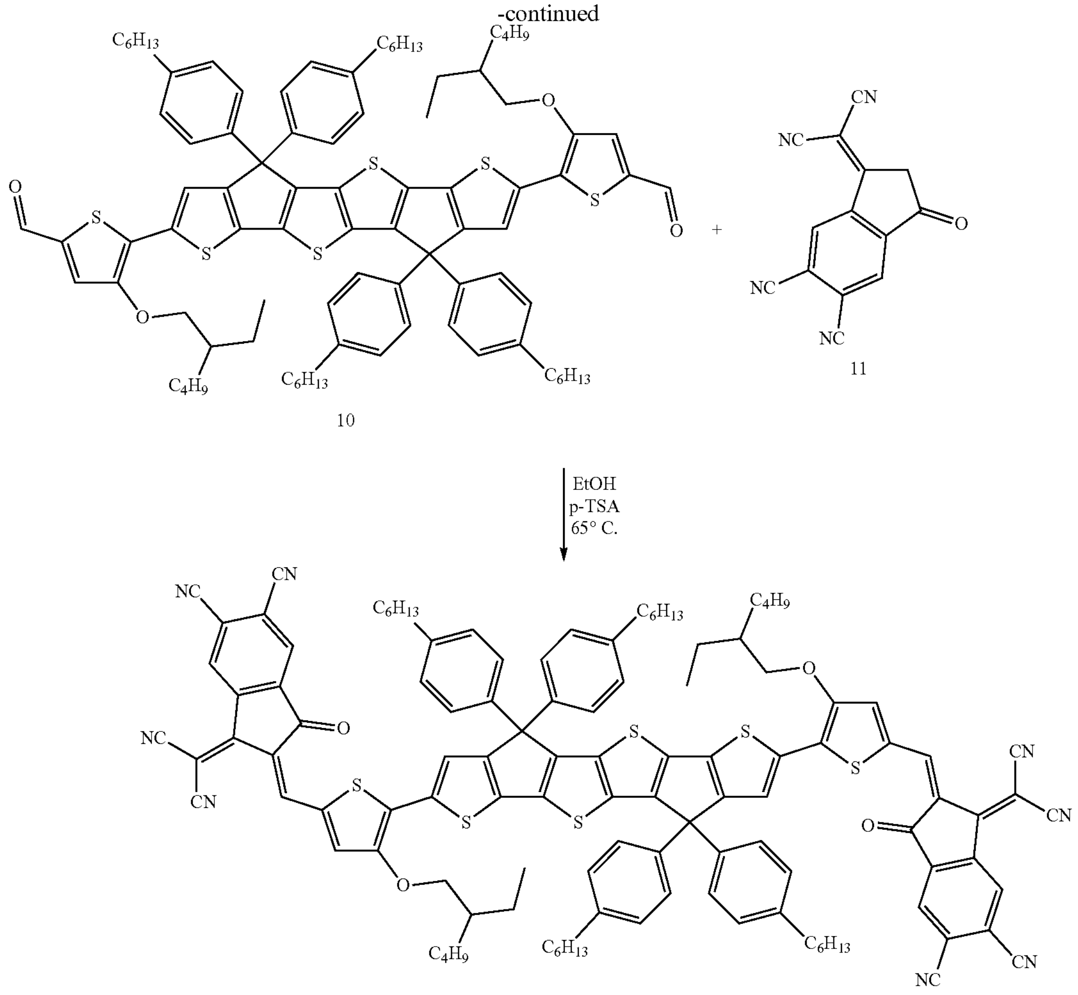

10

11

Intermediate 2:

n-Butyl lithium (97.4 ml, 1.6M, 0.16 mol) was added to a solution of thieno[3,2-b]thiophene (1) (10 g, 0.07 mol) in THF (100 ml) at −78° C. and the mixture stirred at 25° C. for an hour. After cooling to −78° C. trimethyltin chloride (35.5 g, 0.18 mol) in THF (100 ml) was added and the mixture stirred at 25° C. for 16 hours. It was then quenched with water (200 ml) at 0° C., extracted with hexane (200 ml), the organic layer was washed with brine and dried over anhydrous sodium sulphate and concentrated. The curde solid was dissolved in chloroform (50 ml), methanol (250 ml) was added and the mixture stirred at 0° C. for 2 hours. The resulting slurry was filtered, washed with methanol (100 ml) and dried under vacuum to give Intermediate 2 as a white solid (20 g, 60% yield).

HPLC: 98.45%.

$^1$H-NMR (400 MHz, DMSO-$d_6$): δ [ppm]0.362 (s, 18H), 7.38 (s, 2H).

Intermediate 4:

Intermediate 3 can be synthesised as described in Journal of Materials Chemistry A: Materials for Energy and Sustainability (2020), 8, (10), 5163-5170, the contents of which are incorporated herein by reference.

Bis(triphenylphosphine)palladium (II) dichloride (144 mg, 0.2 mmol) was added to a mixture of Intermediate 2 (4.8 g, 0.01 mol) and methyl 2-bromothiophene-3-carboxylate (3) (4.77 g, 0.02 mmol) in degassed toluene (100 ml) and the mixture heated at 80° C. for 16 hours. After cooling, the resulting slurry was filtered, washed with toluene (20 ml) and dried under vacuum to give Intermediate 4 as a yellow solid (4.5 g).

HPLC: 95.7%.

$^1$H-NMR (400 MHz, $CDCl_3$): δ [ppm]1.57 (s, 4H), 3.88 (s, 6H), 7.28 (s, 2H), 7.54 (d, J=5.40 Hz, 2H), 7.69 (s, 2H).

Intermediate 6:

n-butyl lithium (2.5M in hexane, 17.1 ml, 0.04 mol) was added to a solution of 1-bromo-4-hexylbenzene (5) (12.0 g, 0.05 mol) in THF (60 ml) at −100° C. and the mixture stirred for 2.5 hours. Intermediate 4 (3 g, 0.01 mol) was added as a solid and the mixture was allowed to warm to 25° C. and stirred for 16 hours. After cooling to 0° C. it was quenched with $NH_4Cl$ solution (20% aqueous, 30 ml), extracted with ethyl acetate (2×20 ml), washed with brine (30 ml), dried over anhydrous sodium sulphate and concentrated under reduced pressure. The residue was purified silica column chromatography (2% EtOAc in hexane as elunt) to give Intermediate 6 (4.5 g, 63% yield).

LCMS: 96.5%.

$^1$H-NMR (400 MHz, $CDCl_3$): δ [ppm]0.91 (t, J=6.64 Hz, 12H), 1.33-1.37 (m, 24H), 1.59-1.64 (m, 8H), 2.62 (t, J=7.88 Hz, 8H), 3.26 (bs, 2H), 6.47 (d, J=5.36 Hz, 2H), 6.66 (s, 2H), 7.11-7.17 (m, 18H).

Intermediate 7:

Boron trifluoride diethyl etherate (2.74 ml, 0.02 mol) was added dropwise to a solution of Intermediate (6) (4.5 g, 0.004 mol) in dry DCM (60 ml) under nitrogen at 0° C. After stirring at 26° C. for 16 hours the mixture was quenched with ice-water (30 ml), diluted with dichloromethane (50 ml), the organic layer was washed with water (30 ml), dried over anhydrous sodium sulphate and concentrated under reduced pressure. The residue was purified by -silica column chromatography (2 to 5% DCM in hexane as eluent) to give Intermediate 7 as a red-orange solid (2 g, 46% yield).

HPLC: 98.1%.

$^1$H-NMR (400 MHz, $CDCl_3$): δ [ppm]0.88 (t, J=6.84 Hz, 12H), 1.29-1.37 (m, 24H), 1.55-1.63 (m, 8H), 2.56 (t, J=7.92 Hz, 8H), 7.08-7.10 (m, 10H), 7.16-7.18 (m, 10H).

Intermediate 8:

n-butyl lithium (2.5M in hexane, 16.5 ml, 0.04 mol) was added to a solution of Intermediate 7 (10 g, 0.01 mol) in dry THF (150 ml) at −78° C. After 1 hour, tributyl tin chloride (16.9 g, 0.05 mol) in THF (20 ml) was slowly added and the mixture allowed to warm to room temperature and stirred for 16 hours. The solvent was removed under reduced pressure and crude residue triturated with methanol and filtered to give Intermediate 8 as yellow solid (4 g, ~75% desired product by LCMS).

Intermediate 10:

Tri(o-tolyl)phosphine (147 mg, 0.48 mmol) and tris (dibenzylideneacetone)-dipalladium(0) (117 mg, 0.13 mmol) was added to a degassed solution of Intermediate 8 (2.5 g, 1.61 mmol) and 5-bromo-4-[(2-ethylhexyl) oxy] thiophene-2-carbaldehyde (1.28 g, 4.02 mmol) in toluene (150 ml) and the mixture heated to 80° C. for 16 hours. The mixture was concentrated and the crude product purified by silica column chromatography (0 to 50% DCM in hexanes as eluent) to give Intermediate 10 (1.1 g with 81% LCMS purity and 0.3 g with 86% LCMS purity).

Compound Example 2

A degassed solution of Intermediate 10 (550 mg, 0.38 mmol), Intermediate 11 (461 mg, 1.89 mmol) and para-toluene sulfonic acid (540 mg, 2.84 mmol) in ethanol (25 ml) was stirred at 65° C. for 18 hours and the mixture concentrated. A further 550 mg of intermediate 10 was also converted to Compound Example 1 The crude products were combined and purified twice by silica column chromatography (hexane:dichloromethane (1:1) as eluent). Fractions containing the desired product were combined and further triturated with ethanol and filtered to give Compound Example 2 (500 mg).

HPLC: 93.79%.

$^1$H-NMR (400 MHz, $CDCl_3$): δ [ppm]0.87-0.90 (m, 12H), 0.93-0.97 (m, 6H), 0.99-1.04 (m, 6H), 1.29-1.34 (m, 12H), 1.26-1.41 (m, 12H), 1.56-1.67 (m, 24H), 1.85-1.90 (m, 2H), 2.61 (t, J=7.6 Hz, 8H), 4.17 (d, J=4.8 Hz, 4H), 7.15-7.20 (m, 18H), 7.78 (s, 2H), 8.12 (s, 2H), 8.75 (br, s, 2H), 8.98 (s, 2H).

Intermediate 11 was formed according to the following reaction scheme:

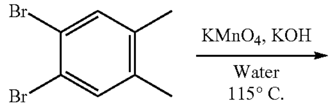

12

-continued

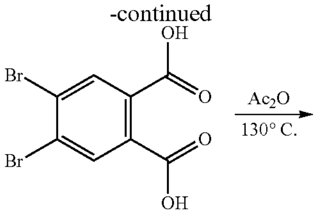

13

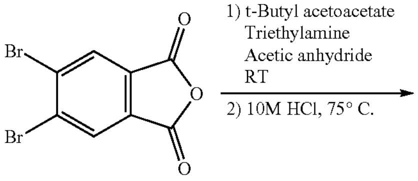

14

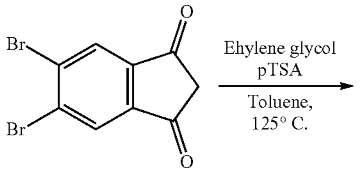

15

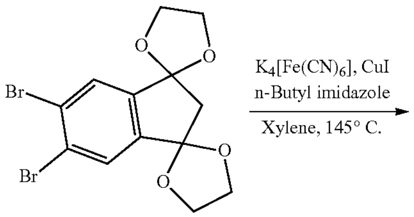

16

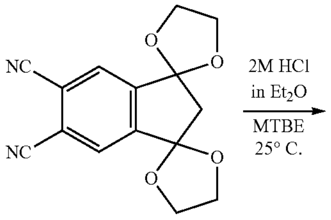

17

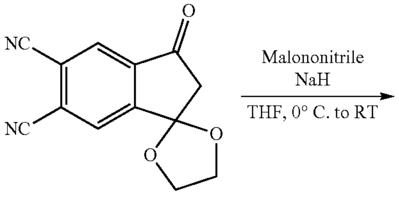

18

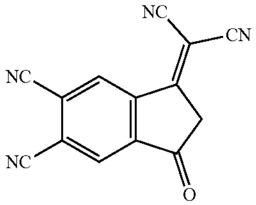

11

Intermediate 13

A mixture of 1,2-Dibromo-4,5-dimethylbenzene (100 g, 0.38 mol), potassium hydroxide (105 g, 1.89 mol) and potassium permanganate (298 g, 1.89 mol) in water (2 L) was heated at 115° C. for 24 hours. After cooling to room temperature, sodium bisulphite was added, the pH was adjusted to 8 using 10% potassium hydroxide solution and the mixture was filtered through a celite pad and washed with water (2×50 ml). The aqueous layer was acidified to a pH of 1 with concentrated HCl to give a white precipitation which was filtered, washed with water (2×250 ml) and triturated with methanol. The resulting solid was filtered and dried under vacuum to give Intermediate 13 (46 g, 38% yield).

$^1$H-NMR (400 MHz, DMSO-d6): δ [ppm]8.18 (s, 2H).

Intermediate 14:

Intermediate 13 (200 g, 618 mmol) in acetic anhydride (1 L) was heated at 130° C. for 4 hours. After cooling to room temperature, the crude solid was filtered, washed with toluene (200 ml) and dried under vacuum to give Intermediate 14 (200 g).

Intermediate 15:

Tert-butylaceto acetate (103 g, 654 mmol) was added to a mixture of Intermediate 14 (200 g, 654 mmol), acetic anhydride (1 L) and triethyl amine (600 ml) and the reaction mixture stirred at 25° C. for 16 hours. After quenching with a mixture of (10 M HCl, 1 L) and ice (1 kg) while maintaining the temperature below 50° C., the mixture was heated to 75° C. for 2 hours and cooled to room temperature. The solid was filtered and dried to give Intermediate 15 as a brown solid (132 g, 68% yield).

LCMS: 96.8%.

$^1$H-NMR (400 MHz, DMSO-d6): δ [ppm]3.28 (s, 2H), 8.25 (s, 2H).

Intermediate 16:

A solution of Intermediate 15 (120 g, 394 mmol), ethylene glycol (244 g, 3.9 mol) and para-toluenesulfonic acid (6.78 g, 39.4 mmol) in toluene (1.5 L) was heated at 125° C. for 40 hours. After cooling to room temperature, the reaction mixture was added to water (500 ml), the organic layer was separated and concentrated under vacuum. The crude residue was suspended in hexane (1 L), stirred for 30 minutes and filtered to give Intermediate 16 (91 g 59% yield).

$^1$H-NMR (400 MHz, CDCl3): δ [ppm]2.56 (s, 2H), 4.09-4.12 (m, 4H), 4.20-4.24 (m, 4H), 7.65 (s, 2H).

Intermediate 17:

Potassium ferrocyanide (48.6 g, 132 mmol), 1-butyl imidazole (42.9 g, 383 mmol) and Copper (I) iodide (12.5 g, 65.6 mmol) were added in three portions to a solution of Intermediate 16 (65 g, 165 mmol) in o-xylene (2.5 L). After heating at 140° C. for 44 hours, the reaction mixture was cooled to room temperature, filtered through a Florisil plug, and washed with toluene followed by ethyl acetate. The filtrate was concentrated under reduced pressure to 1 L and stirred at 25° C. for 16 hours. The resulting solid was filtered, washed with hexanes and purified by silica column chromatography (hexanes:ethyl acetate (2:8) as eluent). Fractions containing the desired product were concentrated under reduced pressure, hexane (1 L) was added to the residue, and the resulting solid was filtered and dried under vacuum to give Intermediate 17 (30 g, 64% yield).

HPLC: 98.9%.

$^1$H-NMR (400 MHz, CDCl3): δ [ppm]2.62 (s, 2H), 4.15-4.21 (m, 4H), 4.24-4.28 (m, 4H), 7.83 (s, 2H).

Intermediate 18:

Hydrogen chloride in diethyl ether (2 M, 500 ml, 1.0 mol) and water (5 ml) were added to a solution of Intermediate 17 (90 g, 316 mmol) in tert-butyl methyl ether (1 L). After stirring at 25° C. for 48 hours. the mixture was filtered, the resulting solid washed with diethyl ether (100 ml×3) and stirred 3 times with acetone (500 ml) for 1 hour and filtered. The resulting solid was dried under vacuum to give Intermediate 18 (61 g, 80% yield).

HPLC: 95%.

1H-NMR (400 MHz, CDCl3): δ [ppm]3.07 (s, 2H), 4.20-4.36 (m, 4H), 8.11 (s, 1H), 8.16 (s, 1H).

Intermediate 11

A solution of malononitrile (5.49 g, 83.2 mmol) in THF (200 ml) was added to a suspension of sodium hydride (3.31 g, 83.2 mmol) in THF (200 ml) at 25° C. and stirred at 25° C. for an hour. The resulting mixture was added to a suspension of Intermediate 18 (20 g, 83.2 mmol) in THF (600 mL) at 0° C., and the reaction mixture stirred at 25° C. for 16 hours. The resulting mixture was concentrated under vacuum to give a crude dark purple solid. This procedure was repeated on another 40 g of intermediate 18. The crude material was combined and purified by silica column chromatography (10 to 20% MeOH in DCM as elunt). Fractions containing the desired product were combined, concentrated under reduced pressure and the residue stirred in a mixture of dichloromethane and acetonitrile to give Intermediate 11 (20.2 g, 33% yield).

LCMS: 96.35% purity.

$^1$H-NMR (400 MHz, CD3OD): δ [ppm]3.61 (s, 2H), 5.55 (s, 1H), 7.73 (s, 1H), 8.29 (s, 1H).

Compound Example 3

Compound Example 3 may be prepared according to Scheme 3:

Scheme 3

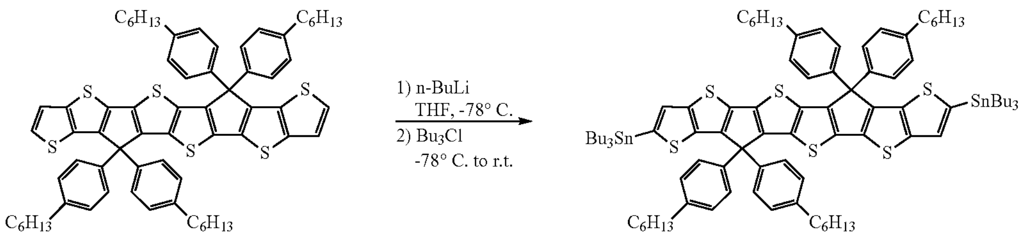

20 21

+

-continued
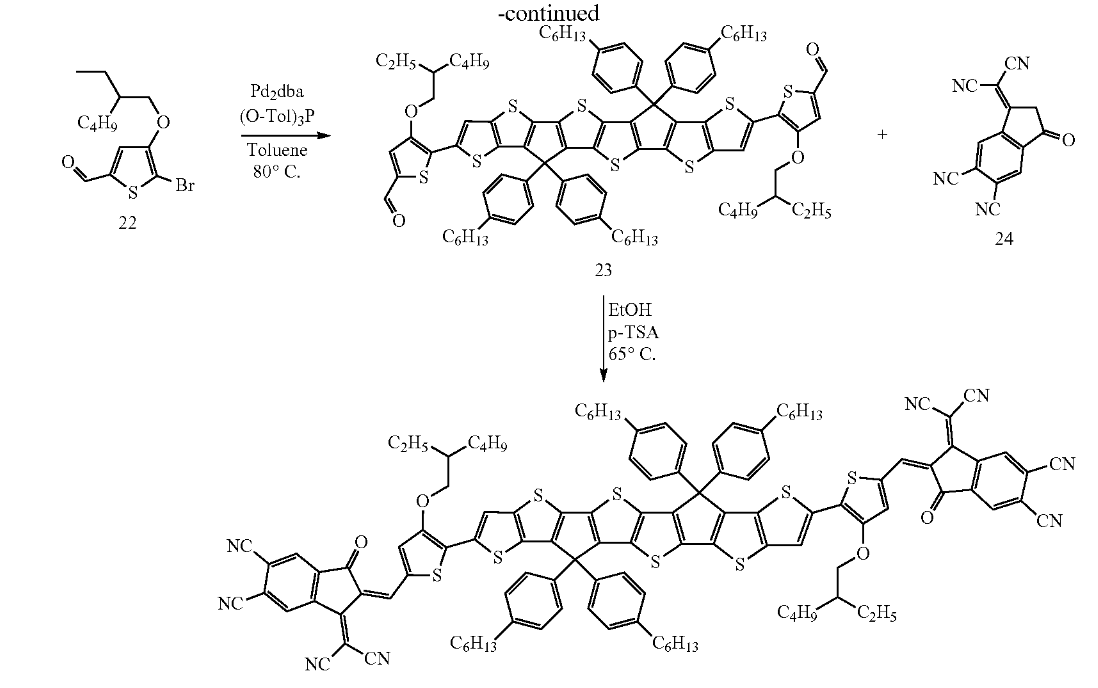
22
23
24
Compound Example 3
Intermediate 20 can be synthesised as described in *Adv. Sci.* 2018, 5, 1800307, the contents of which are incorporated herein by reference.
Modelling Data
LUMO levels and HOMO-LUMO bandgaps of the following compounds were modelled:
Model Comparative Compound 1
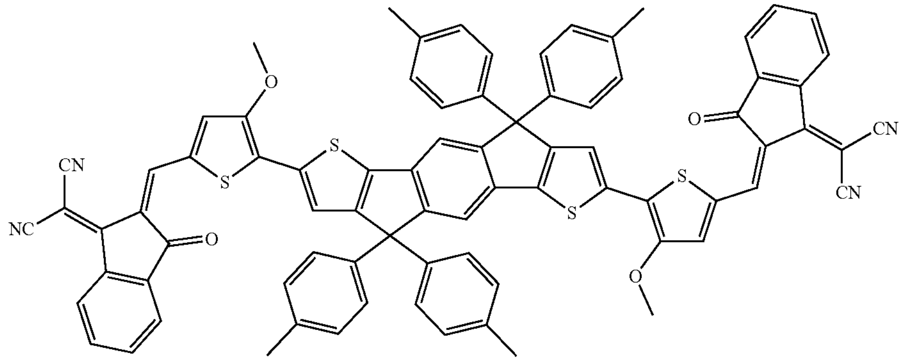
Model Comparative Compound 2
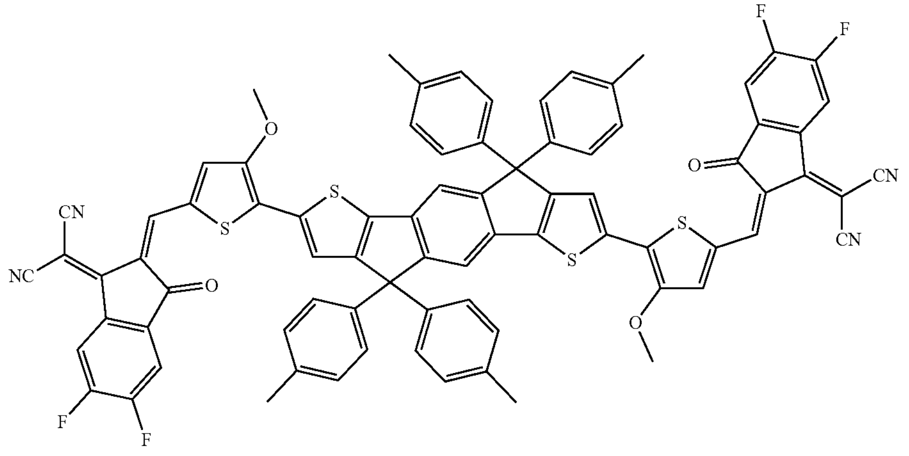

-continued
Model Comparative example 1
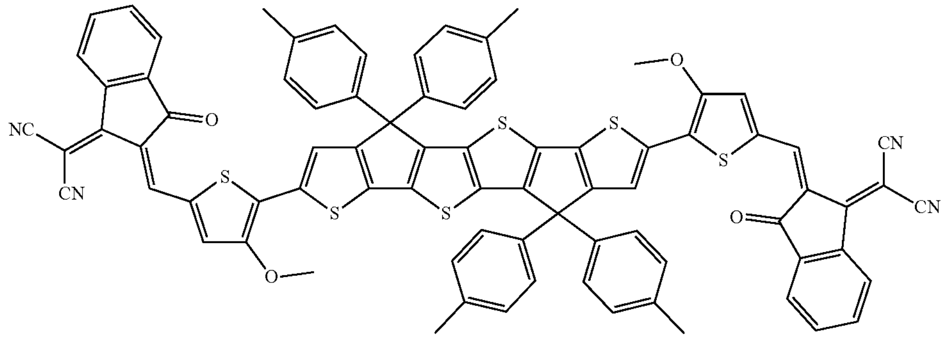
Model Compound example 2
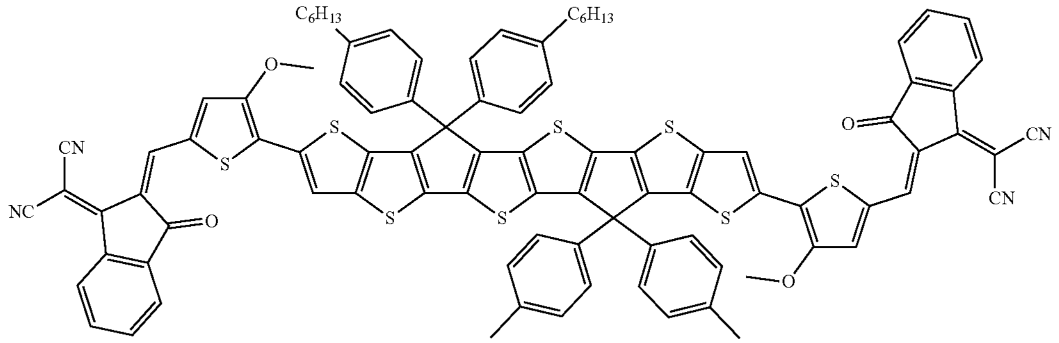
Model Comparative Compound 3
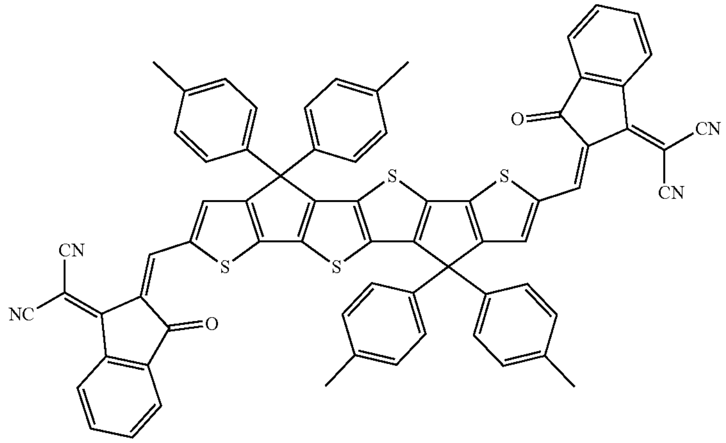
Model Compound Example 3
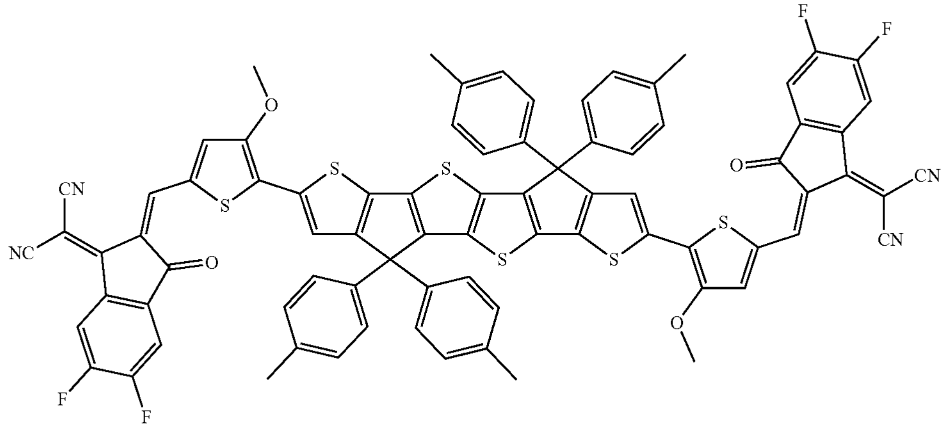

-continued

Model Compound Example 4

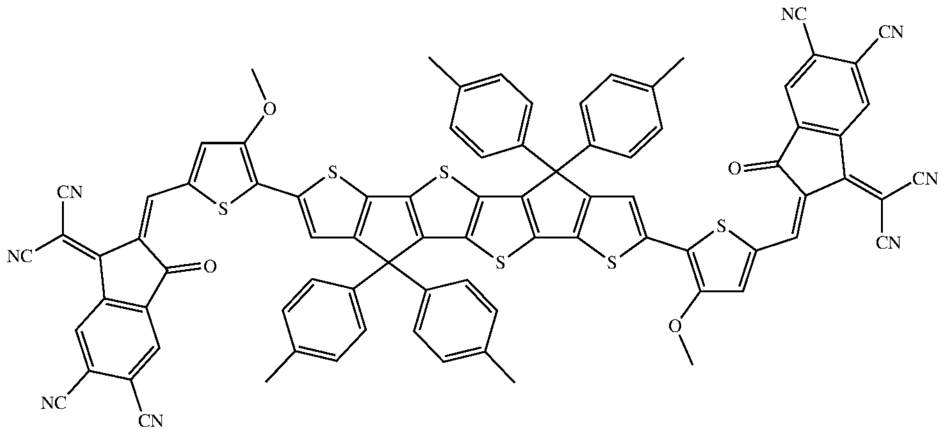

Model Compound Example 5

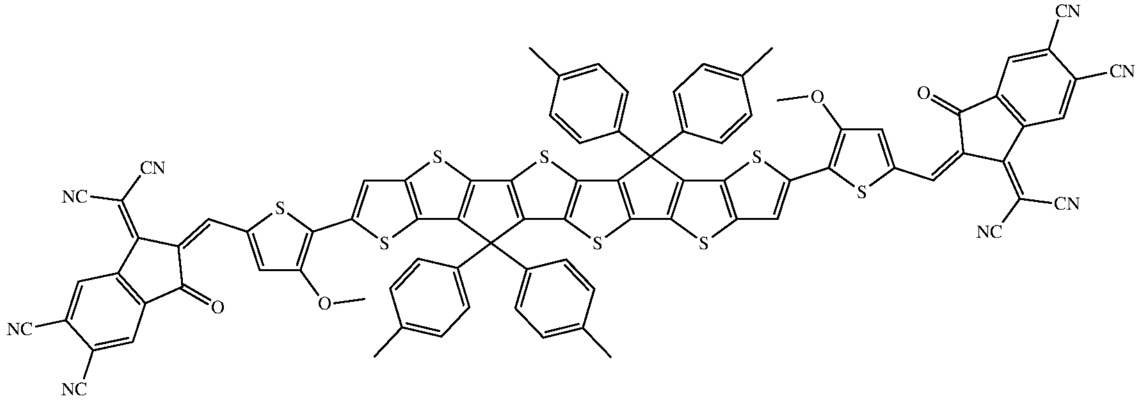

Quantum chemical modelling was performed using Gaussian09 software available from Gaussian using Gaussian09 with B3LYP (functional) and LACVP* (Basis set).

TABLE 1

| Compound | HOMO (eV) | LUMO (eV) | Band gap (eV) |
|---|---|---|---|
| Model Comparative Compound 1 | −5.028 | −3.262 | 1.767 |
| Model Comparative Compound 2 | −5.129 | −3.389 | −1.740 |
| Model Compound Example 1 | −4.839 | −3.267 | 1.572 |
| Model Compound Example 2 | −4.816 | −3.235 | 1.580 |
| Model Comparative Compound 3 | −5.375 | −3.419 | 1.956 |
| Model Compound Example 3 | −4.95 | −3.41 | 1.54 |
| Model Compound Example 4 | −5.28 | −3.85 | 1.44 |
| Model Compound Example 5 | −5.20 | −3.80 | 1.40 |

With reference to Table 1, Model Compound Examples 1 and 2 have a HOMO which is shallower (i.e. closer to vacuum level) and a smaller band gap than Model Comparative Compounds 1 or 2.

HOMO and LUMO Measurements

HOMO and LUMO values of Compound Example 1 were measured by square wave voltammetry.

In square wave voltammetry, the current at a working electrode is measured while the potential between the working electrode and a reference electrode is swept linearly in time. The difference current between a forward and reverse pulse is plotted as a function of potential to yield a voltammogram. Measurement may be with a CHI 660D Potentiostat.

The apparatus to measure HOMO or LUMO energy levels by SWV comprised a cell containing 0.1 M tertiary butyl ammonium hexafluorophosphate in acetonitrile; a 3 mm diameter glassy carbon working electrode; a platinum counter electrode and a leak free Ag/AgCl reference electrode.

Ferrocene was added directly to the existing cell at the end of the experiment for calculation purposes where the potentials are determined for the oxidation and reduction of ferrocene versus Ag/AgCl using cyclic voltammetry (CV).

The sample was dissolved in Toluene (3 mg/ml) and spun at 3000 rpm directly on to the glassy carbon working electrode.

$$LUMO = 4.8 - E \text{ ferrocene (peak to peak average)} - E \text{ reduction of sample (peak maximum)}.$$

$$HOMO = 4.8 - E \text{ ferrocene (peak to peak average)} - E \text{ oxidation of sample (peak maximum)}.$$

A typical SWV experiment runs at 15 Hz frequency; 25 mV amplitude and 0.004 V increment steps. Results were calculated from 3 freshly spun film samples for both the HOMO and LUMO data.

TABLE 2

| | HOMO Film (eV) | LUMO Film (eV) | $B_G$ Film (eV) |
|---|---|---|---|
| Compound Example 2 | −5.26 | −4.23 | 1.03 |
| Compound Example 4 | −5.28 | −4.00 | 1.28 |

Compound Example 4

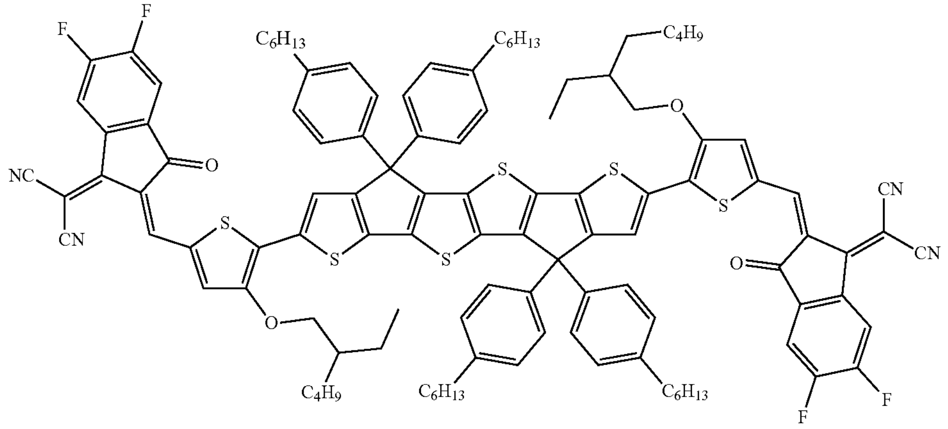

As shown in Table 2, Compound Example 2 has a significantly smaller band gap and significantly deeper LUMO than Compound Example 4.

Absorption Measurements

Figure 2:
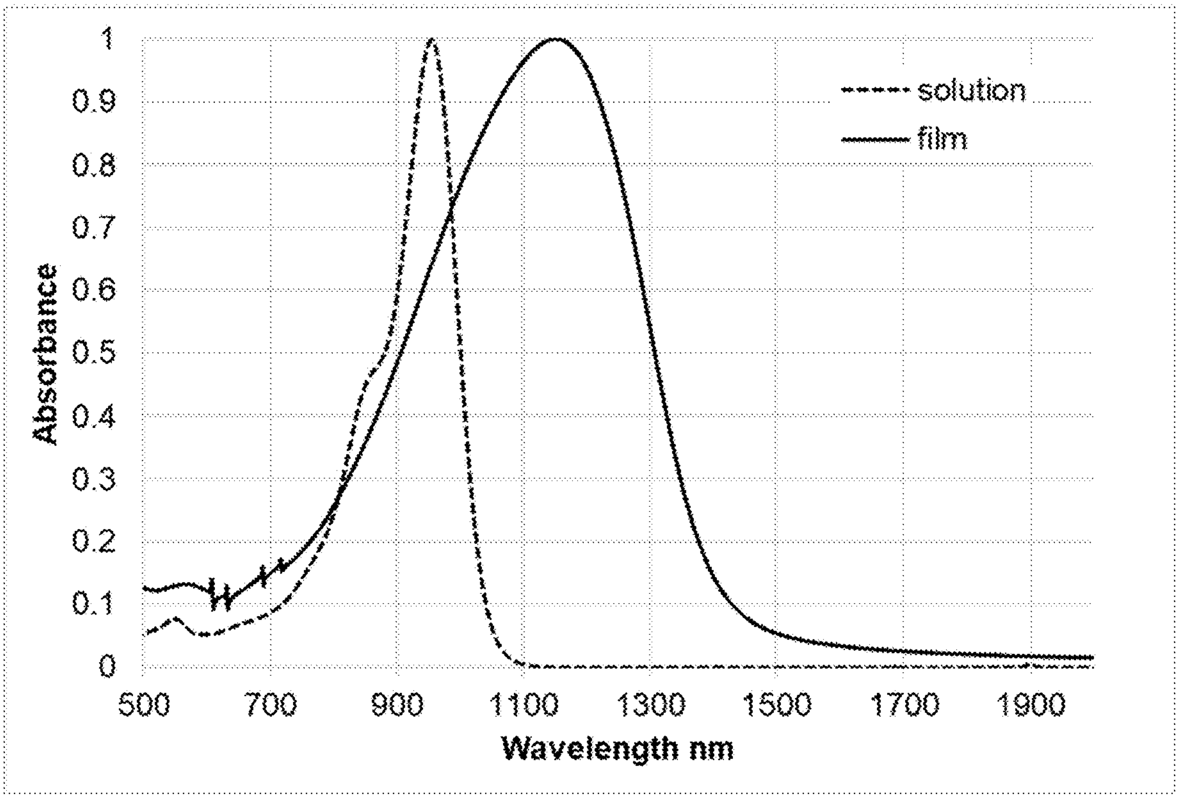
FIG. 2 shows solution and film absorption spectra for a compound of formula (I)

FIG. 2 shows absorption spectra of Compound Example 2 in film, cast from a 15 mg/ml solution, and in a 15 mg/ml solution.

Absorption spectra were in solution and in film using a Cary 5000 UV-vis-IR spectrometer. As shown in FIG. 3, Compound Example 2 shows absorption in film at wavelengths of up to about 1500 nm.

Device Example 1

A device having the following structure was prepared:

Cathode/Donor: Acceptor layer/Anode

A glass substrate coated with a 150 nm thick layer of indium-tin oxide (ITO) was coated with a 2.0% polyethyleneimine (PEIE) solution in isopropyl alcohol to form a ~5 nm film modifying the work function of the ITO. A ca. 500 nm thick bulk heterojunction layer of a mixture of Donor Polymer 1: Compound Example 2: $C_{60}$PCBM (1:1.25:0.25 by weight) was deposited over the modified ITO layer by bar coating from a 15 mg/ml 1,2,4 trimethylbenzene; dimethoxybenzene 95:5 v/v solvent mixture. An anode stack of $MoO_3$ (10 nm) and ITO (50 nm) was formed over the bulk heterojunction by thermal evaporation ($MoO_3$) and sputtering (ITO).

Polymers containing the repeat units of Donor Polymer 1 are described in WO 2021/161793, the contents of which are incorporated herein by reference:

Donor Polymer 1

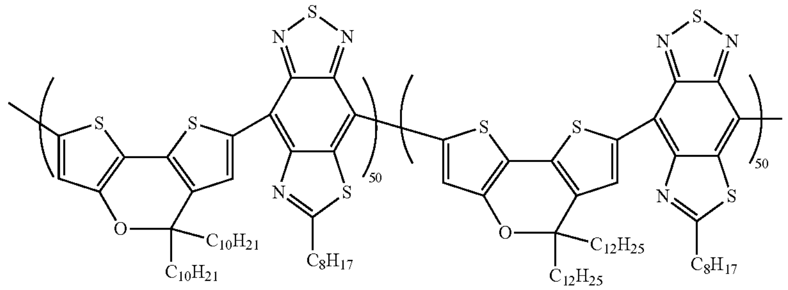

Comparative Device 1

A device was formed as described for Device Example 1 except that $C_{60}$PCBM was not included in the bulk heterojunction layer and the Donor Polymer 1: Compound Example 2 weight ratio was 1:1.5.

Figure 3A:
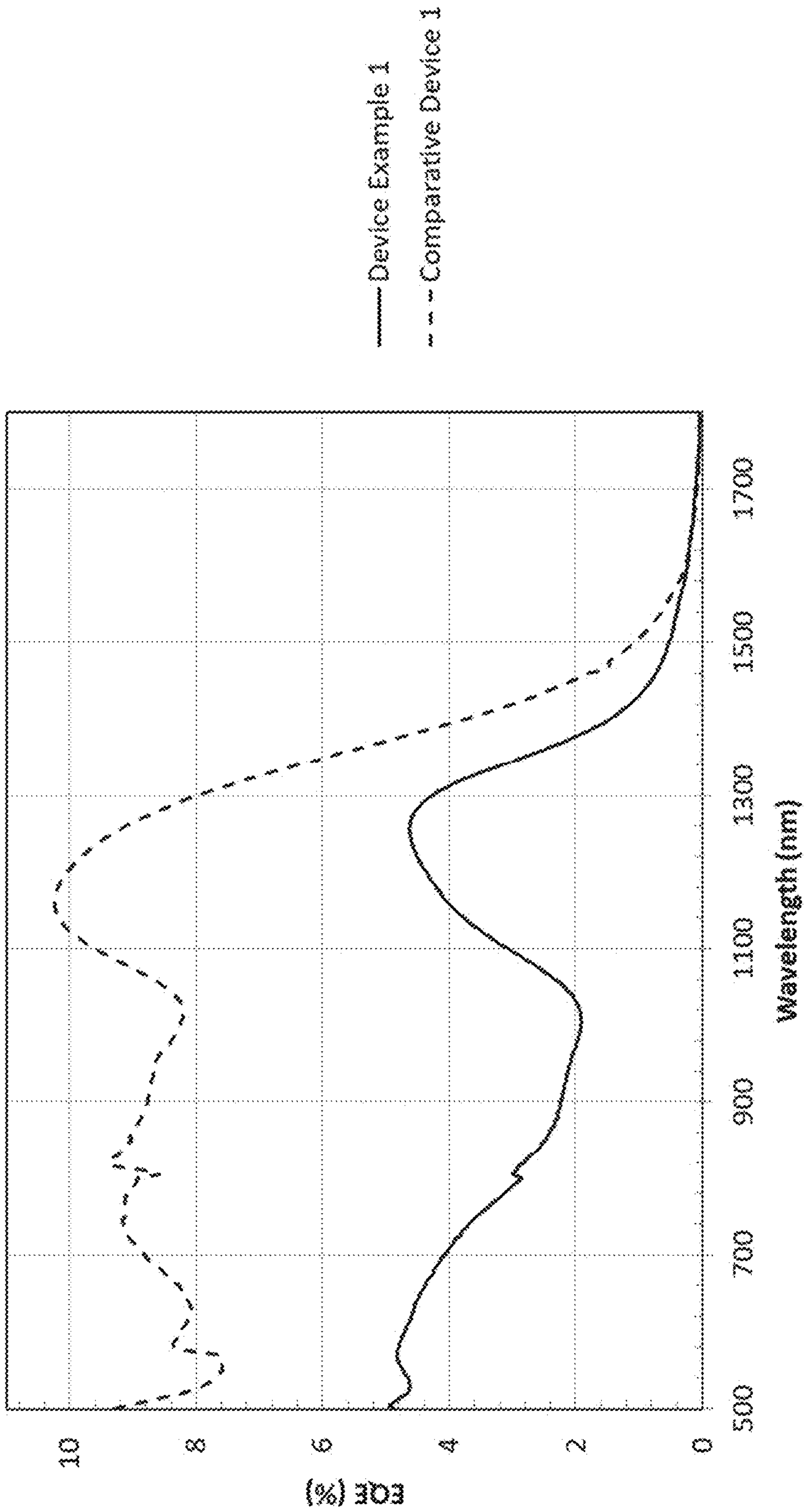
FIG. 3A shows external quantum efficiencies measured at 3V in reverse bias of an organic photodetector containing Donor Polymer 1, a fullerene and a non-fullerene acceptor of formula (I), and of an organic photodetector in which the fullerene is not present.
Figure 3B:
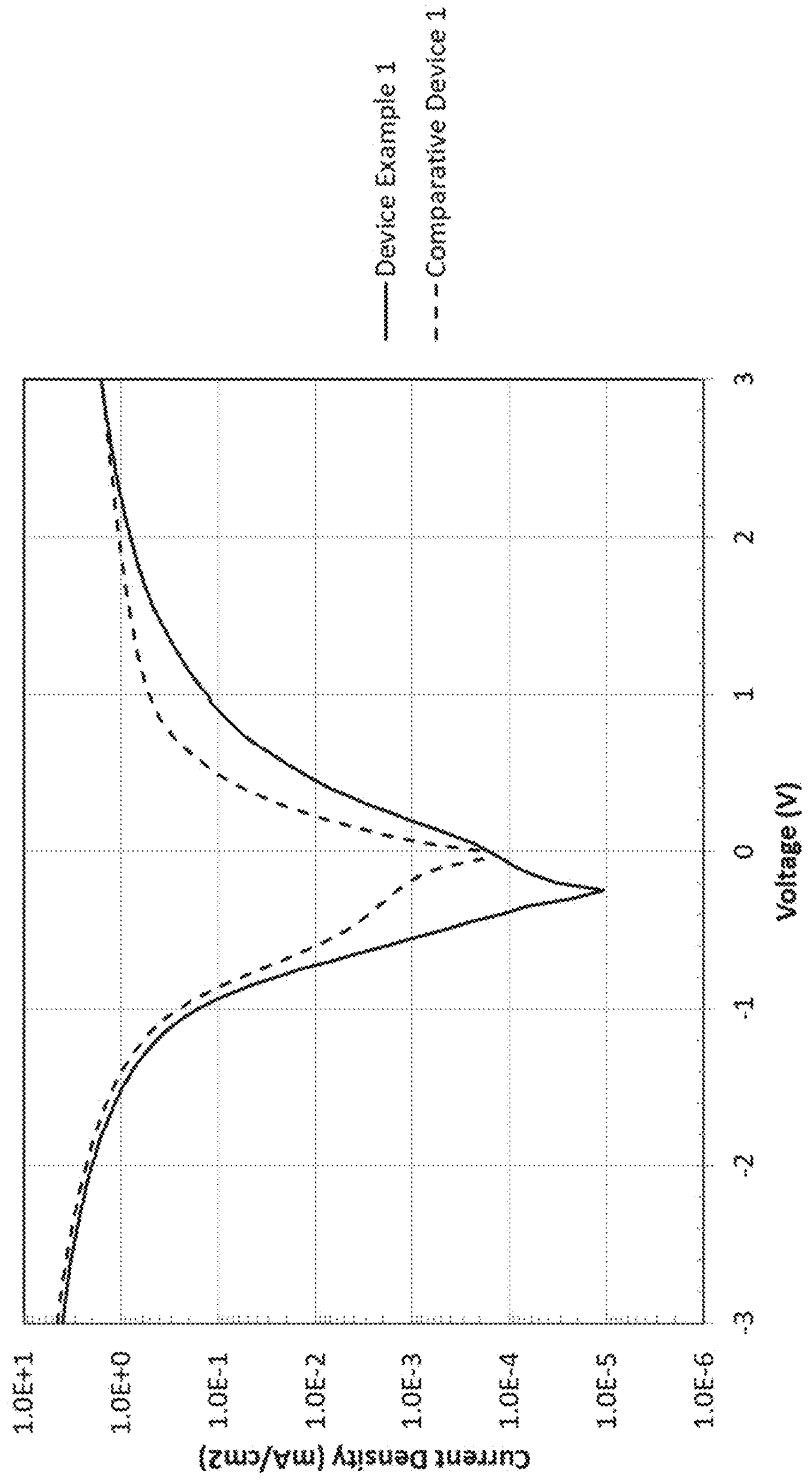
FIG. 3B shows the dark currents for the devices of FIG. 3A.

With reference to FIG. 3A, inclusion of a fullerene in the photoactive layer of Device Example 1 dramatically increases external quantum efficiency, with more than a doubling at around 1250 nm, as compared to Comparative Device 1. With reference to FIG. 3B, no significant change in dark current at a 3V reverse bias was observed.

Device Example 2A

A glass substrate coated with a 150 nm thick layer of indium-tin oxide (ITO) was coated with a 0.2% polyethyleneimine (PEIE) solution in water to form a −5 nm film modifying the work function of the ITO. A ca. 500 nm thick bulk heterojunction layer of a mixture of Donor Polymer 2: Compound Example 2: $C_{60}$PCBM (1:0.7:0.3 by weight) was deposited over the modified ITO layer by bar coating from a 15 mg/ml 1,2,4 trimethylbenzene; dimethoxybenzene 95:5 v/v solvent mixture. An anode stack of $MoO_3$ (10 nm) and ITO (50 nm) was formed over the bulk heterojunction by thermal evaporation ($MoO_3$) and sputtering (ITO).

Donor Polymer 2 may be prepared as described in WO2013/051676, the contents of which are incorporated herein by reference.

Comparative Device 2

A device was formed as described for Device Example 2A except that $C_{60}$PCBM was not included in the bulk heterojunction layer and the Donor Polymer 2: Compound Example 2 weight ratio was 1:0.8.

Figure 4A:
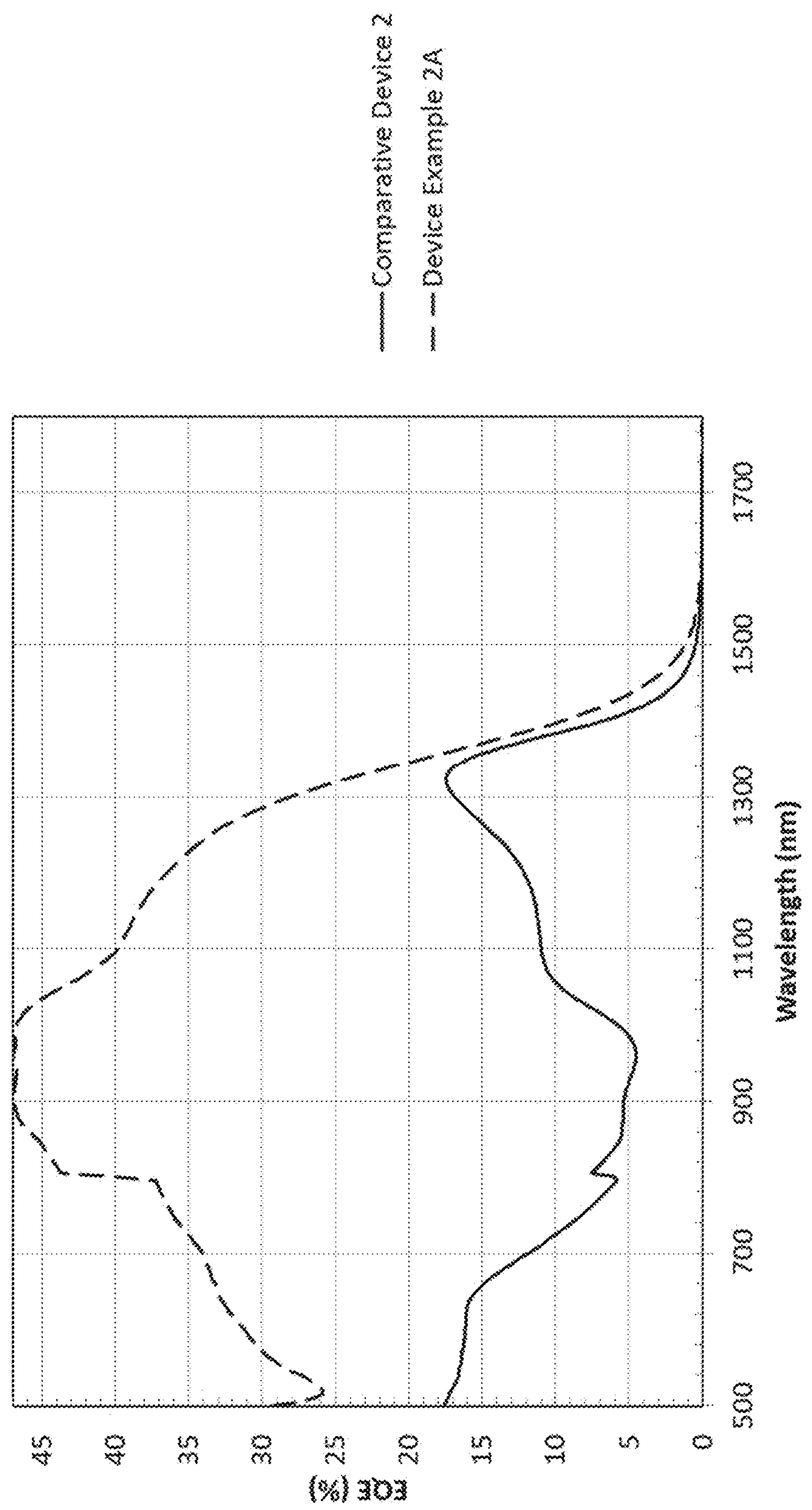
FIG. 4A shows external quantum efficiencies measured at 3V in reverse bias of an organic photodetector containing Donor Polymer 2, a fullerene and a non-fullerene acceptor of formula (I), and of an organic photodetector in which the fullerene is not present.

With reference to FIG. 4A, and as with Device Example 2A, inclusion of a fullerene in the photoactive layer of Device Example 3 dramatically increases external quantum efficiency as compared to Comparative Device 2. Reverse bias dark current at 3V is also halved, from 98.8 $\mu A/cm^2$ to 48.3 $\mu A/cm^2$.

Device Example 2B

A device was prepared as described for Device Example 2A except that $C_{60}$ bis-PCBM was used in place of $C_{60}$PCBM.

Device Example 2C

A device was prepared as described for Device Example 2A except that $C_{60}$IPH was used in place of $C_{60}$PCBM.

Figure 4B:
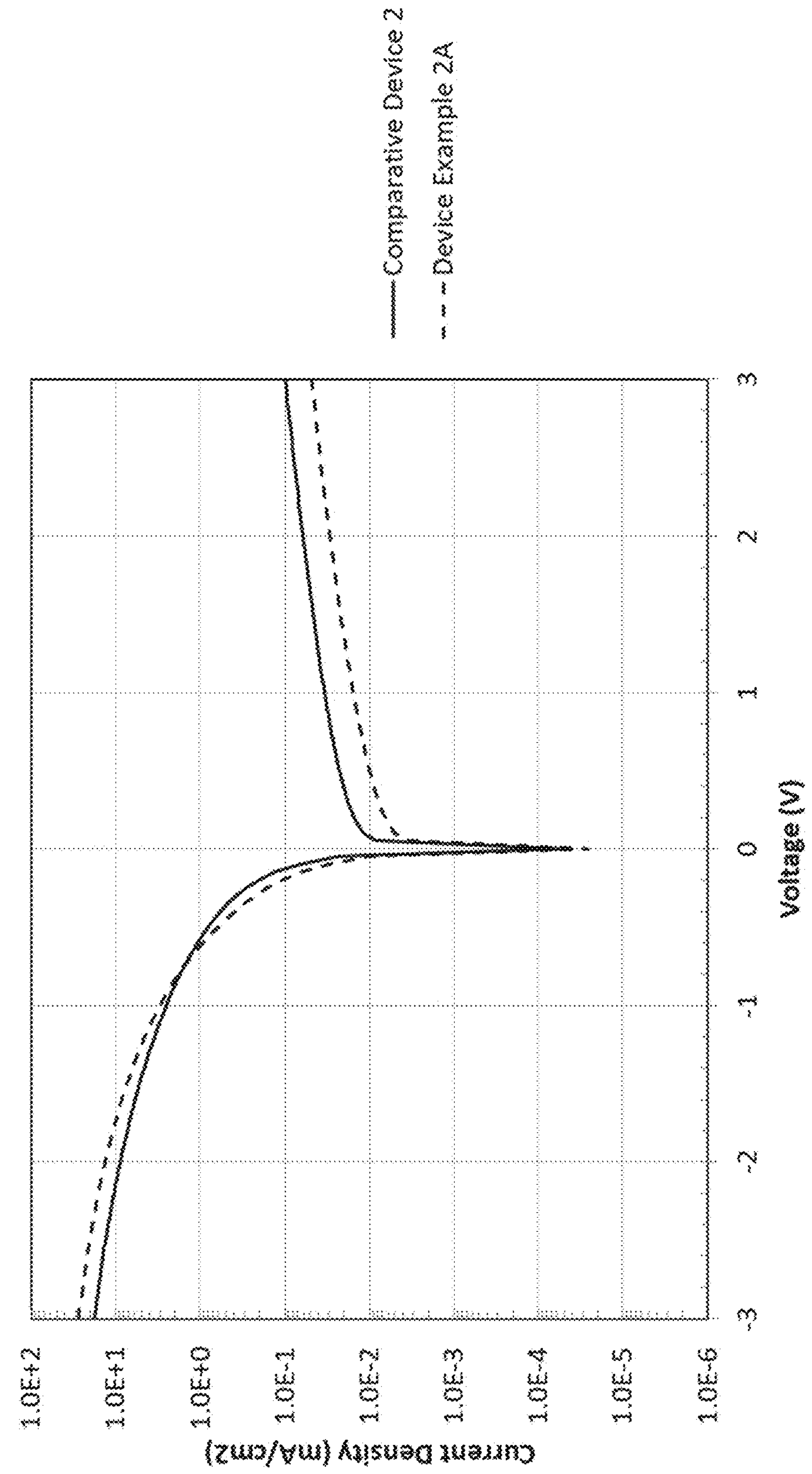
FIG. 4B shows the dark currents for the devices of FIG. 4A.

With reference to FIGS. 4A and 4B, Device Examples 2A, 2B and 2C, which all contain both Compound Example 2 and a fullerene, all show high EQE and similar dark currents, demonstrating the advantage of the inclusion of a range of different fullerenes.

Comparative Device 3A

A device was prepared as described for Device Example 2A except that the bulk heterojunction layer contained a mixture of Donor Polymer 2: Comparative Compound 2: $C_{60}$PCBM (1:0.8:0.2 by weight).

Donor Polymer 2

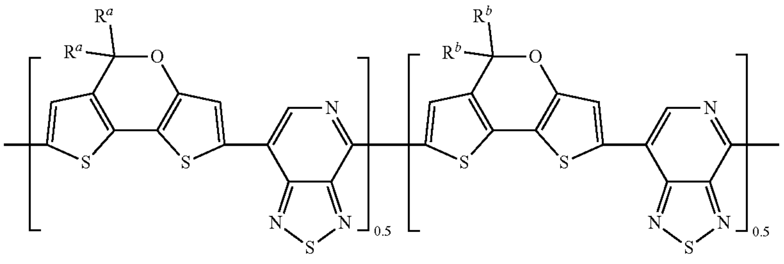

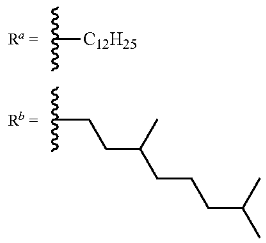

Compararive Compound 2

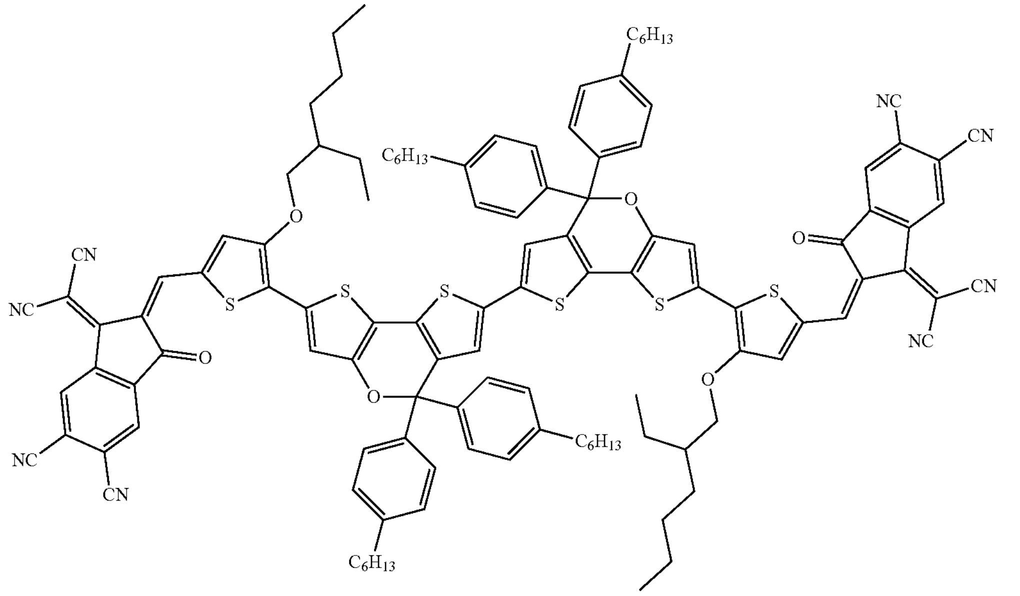

Comparative Device 3B

For the purpose of comparison, a device was formed as described for Device Example 3A except that $C_{60}$PCBM was not included in the bulk heterojunction layer and the Donor Polymer 2: Comparative Compound 2 weight ratio was 1:0.8.

Figure 5A:
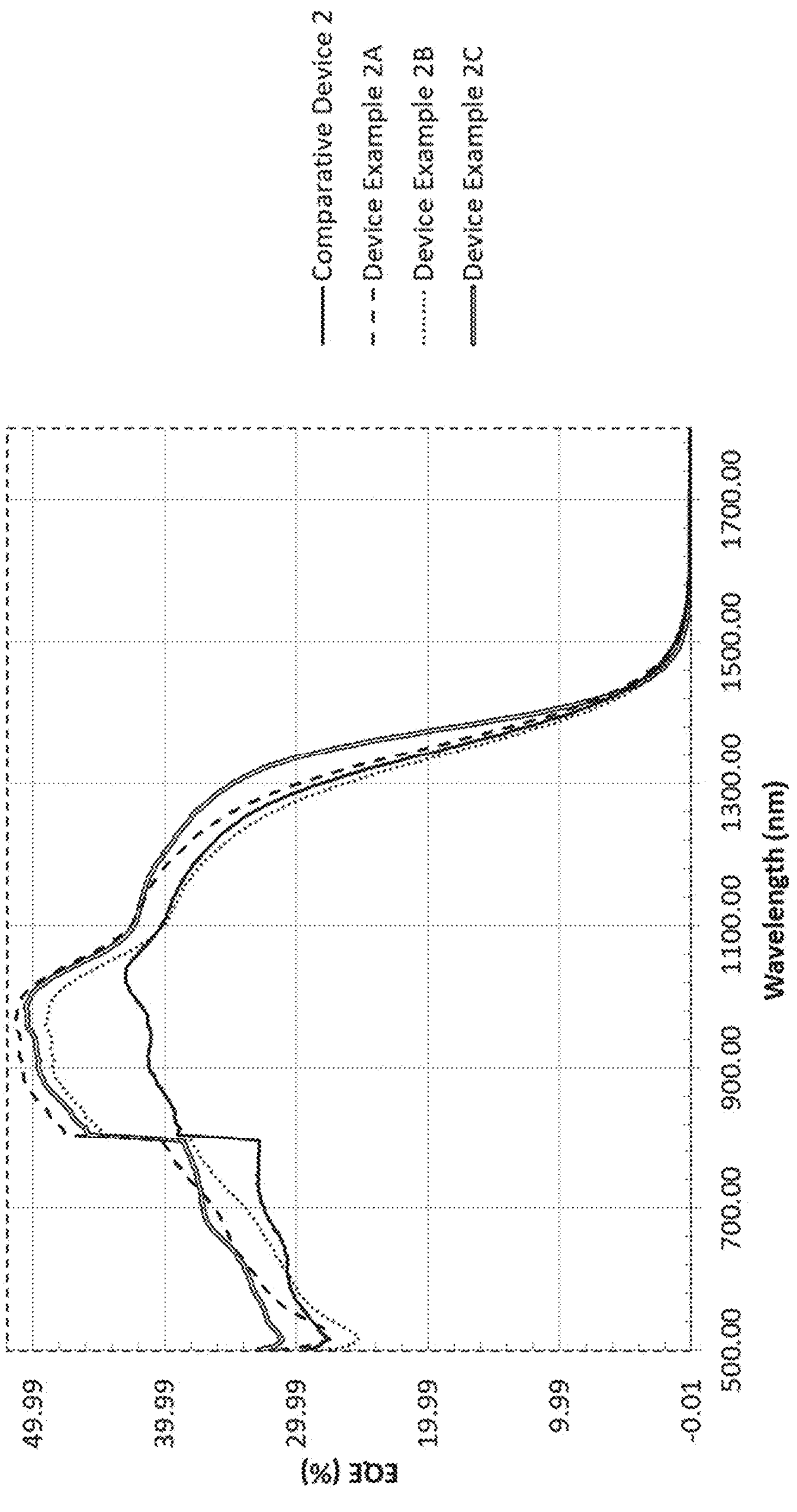
FIG. 5A shows external quantum efficiencies measured at 3V in reverse bias of organic photodetectors containing Donor Polymer 2, a non-fullerene acceptor of formula (I) and $C_{60}$PCBM, $C_{60}$bisPCBM or $C_{60}$IPH.
Figure 5B:
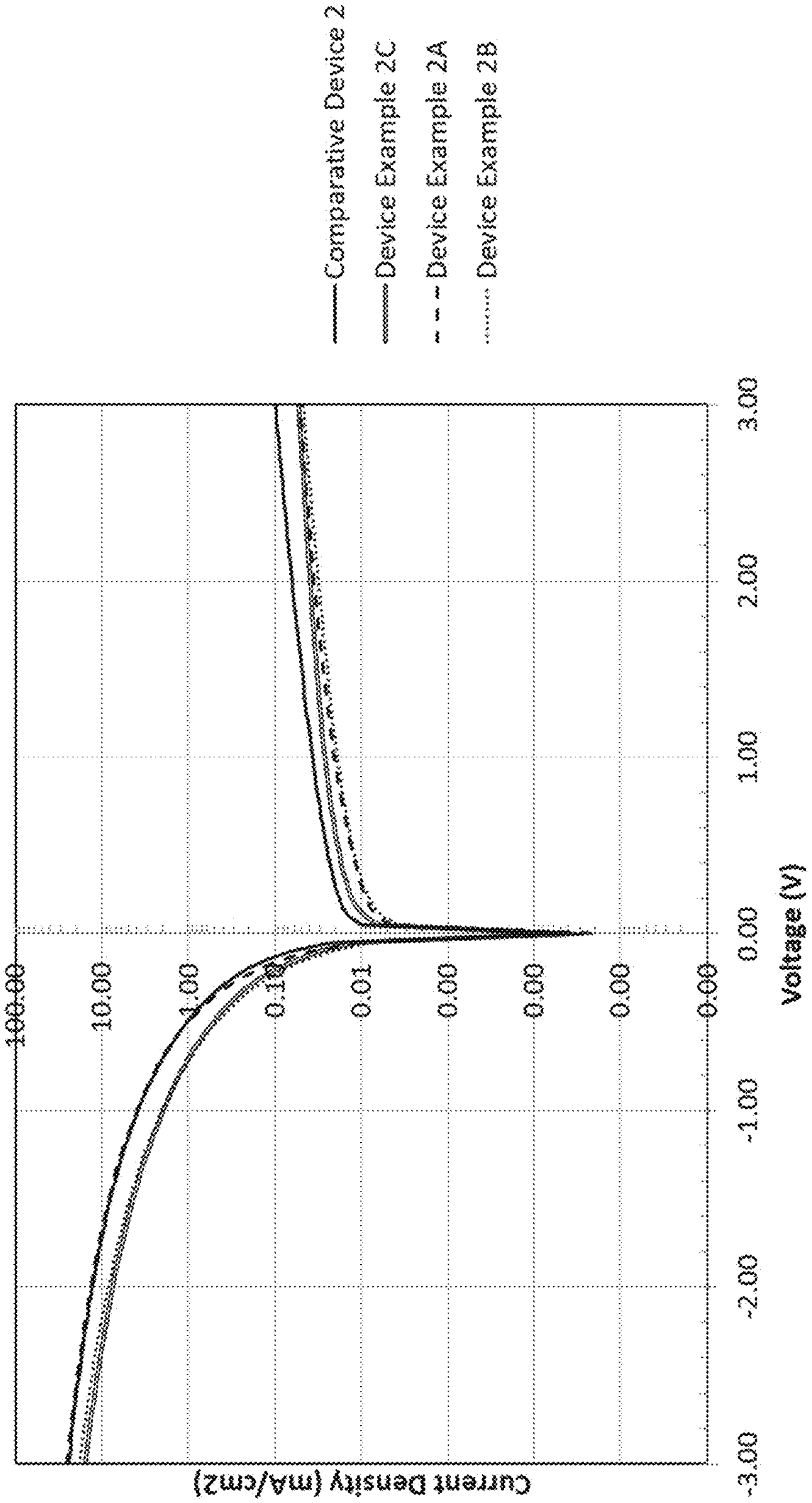
FIG. 5B shows the dark currents for the devices of FIG. 5A.

With reference to FIG. 5A, although an increase in external quantum efficiency is observed upon inclusion of a fullerene in the photoactive layer, the increase is much smaller than that observed for Device Examples 1 or 2A containing Compound Example 2.

Comparative Device 4A

A device was prepared as described for Device Example 2A except that the bulk heterojunction layer contained Donor Polymer 2: Comparative Compound 1 $C_{60}$PCBM in a 1:1.5:0.3 weight ratio.

Comparative Device 4B

For the purpose of comparison, a device was formed as described for Device Example 4A except that $C_{60}$PCBM was not included in the bulk heterojunction layer and the Donor Polymer 2: Comparative Compound 1 weight ratio was 1:1.5.

Figure 6A:
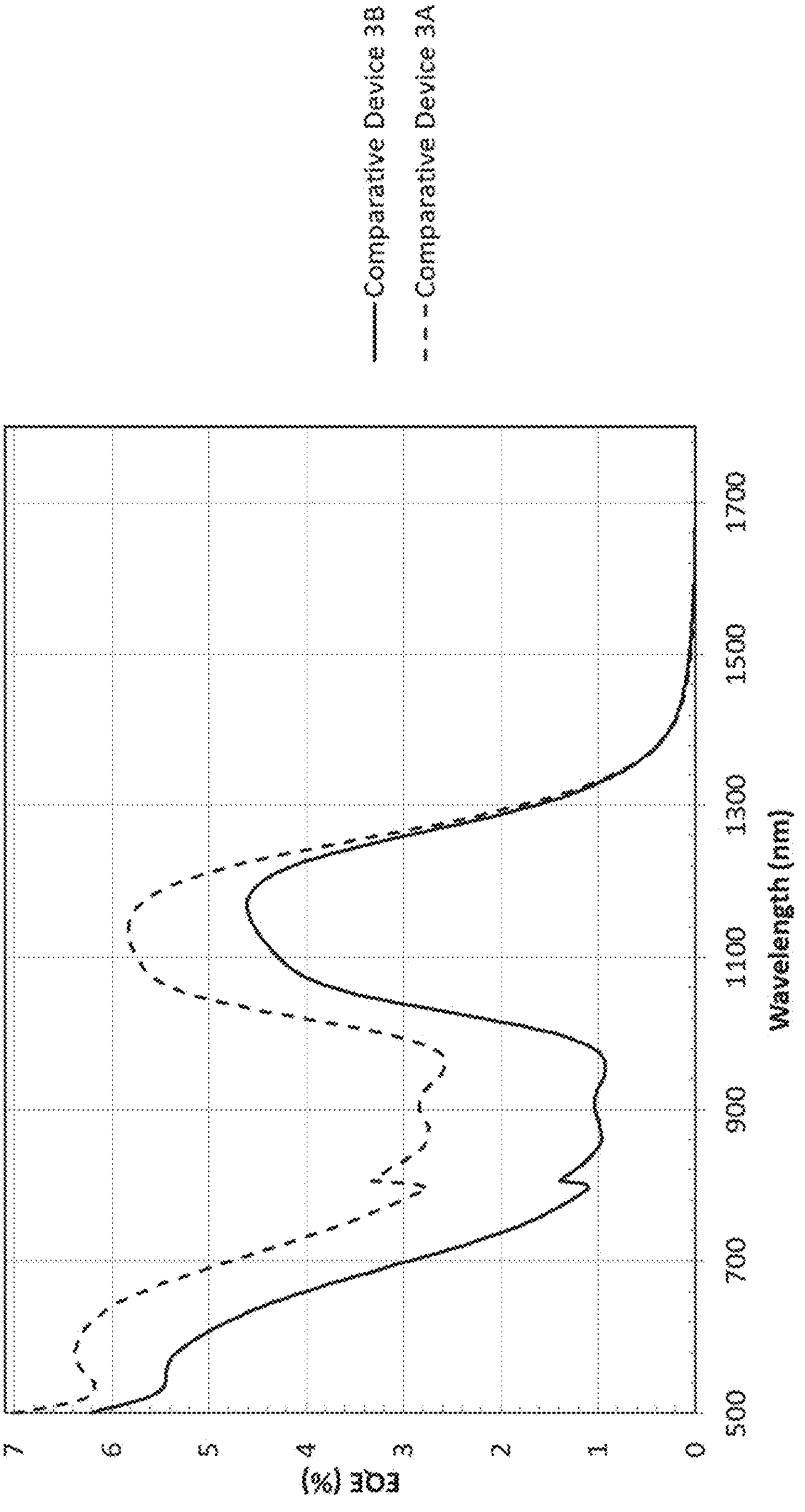
FIG. 6A shows external quantum efficiencies measured at 3V in reverse bias of an organic photodetector containing Donor Polymer 2, Comparative Compound 2 and a fullerene, and of an organic photodetector in which the fullerene is not present.
Figure 6B:
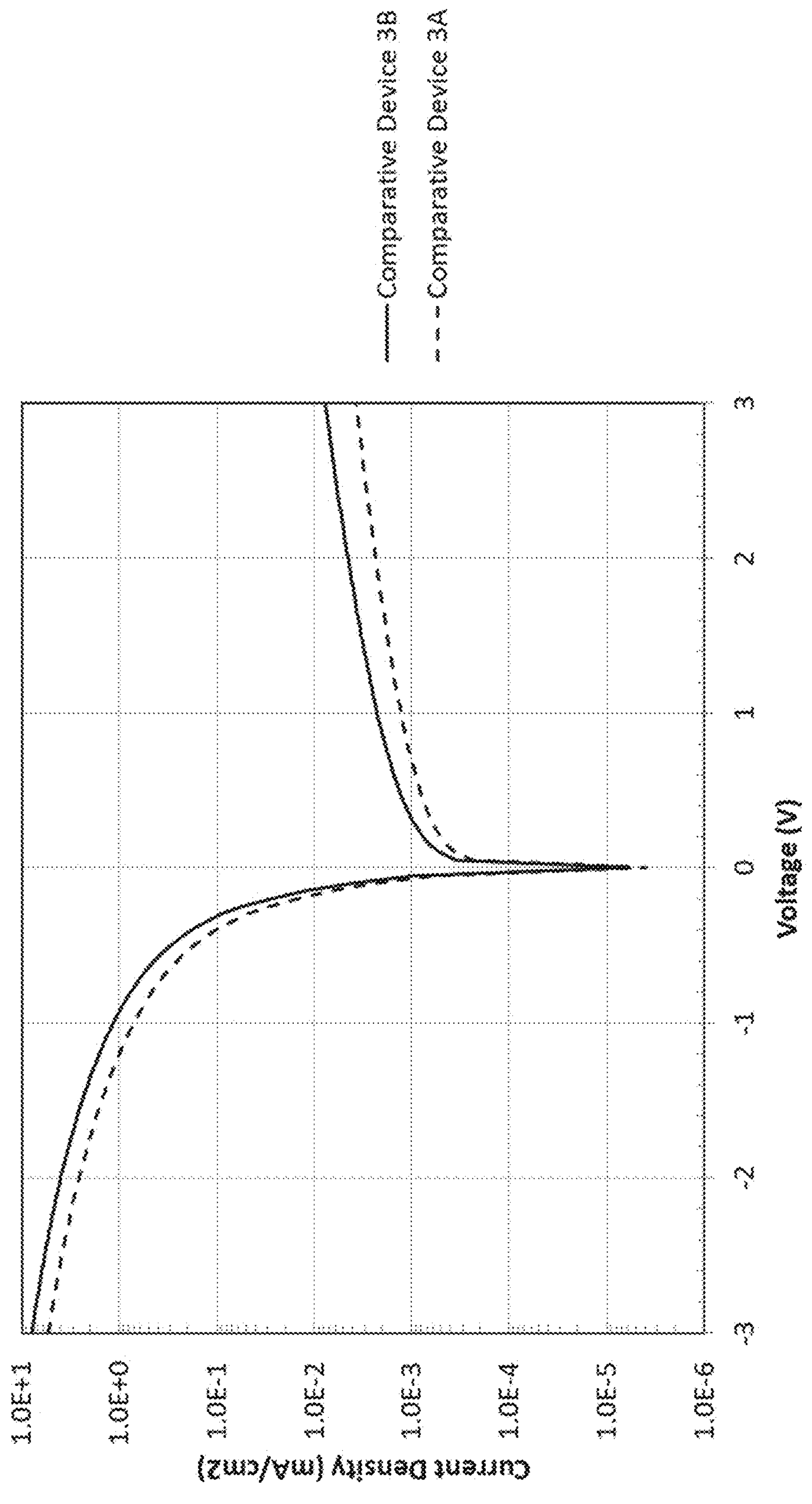
FIG. 6B shows the dark currents for the devices of FIG. 9A.
Figure 7A:
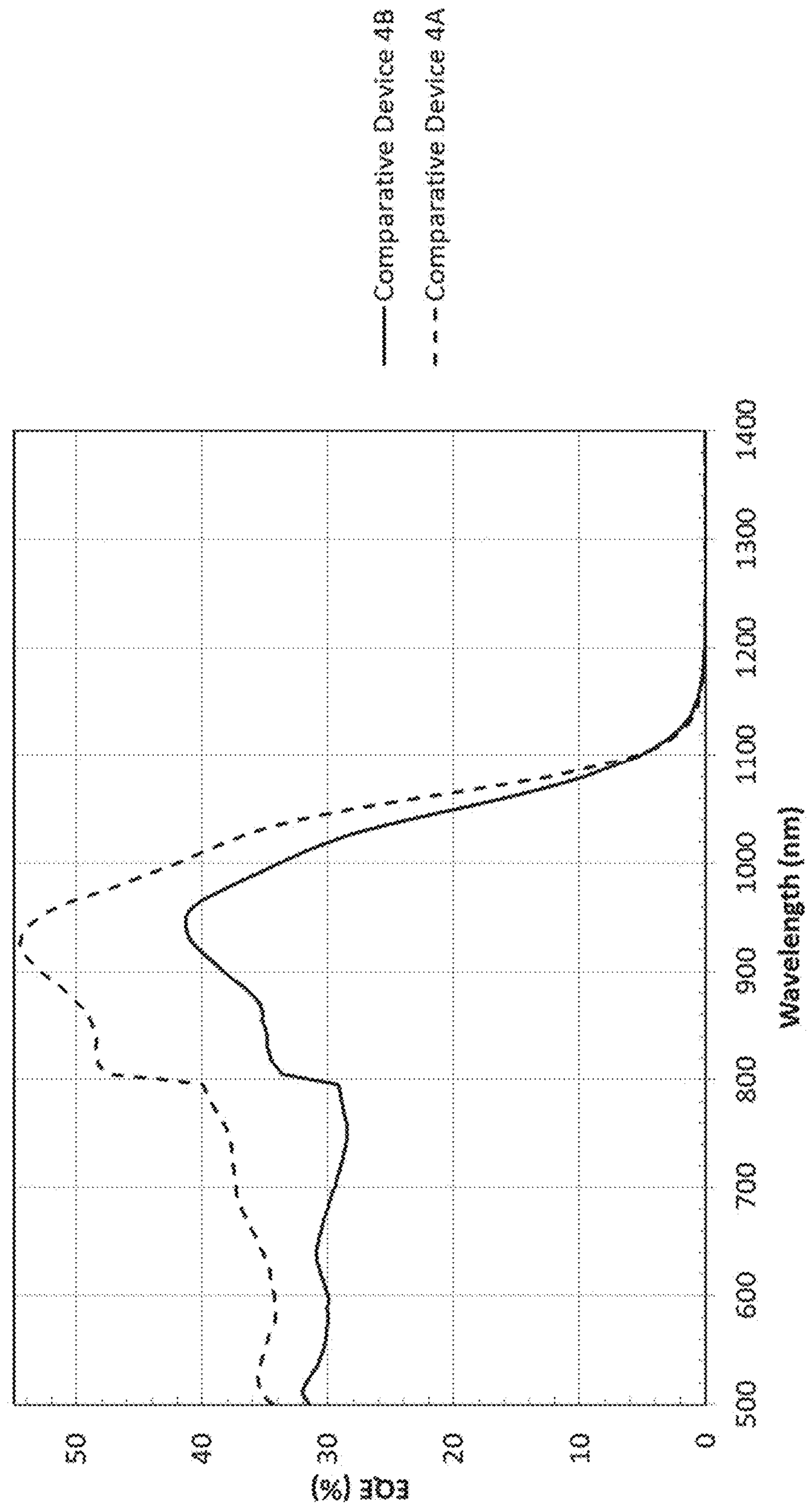
FIG. 7A shows external quantum efficiencies measured at 3V in reverse bias of an organic photodetector containing Donor Polymer 2, Comparative Compound 1 and a fullerene, and of an organic photodetector in which the fullerene is not present.
Figure 7B:
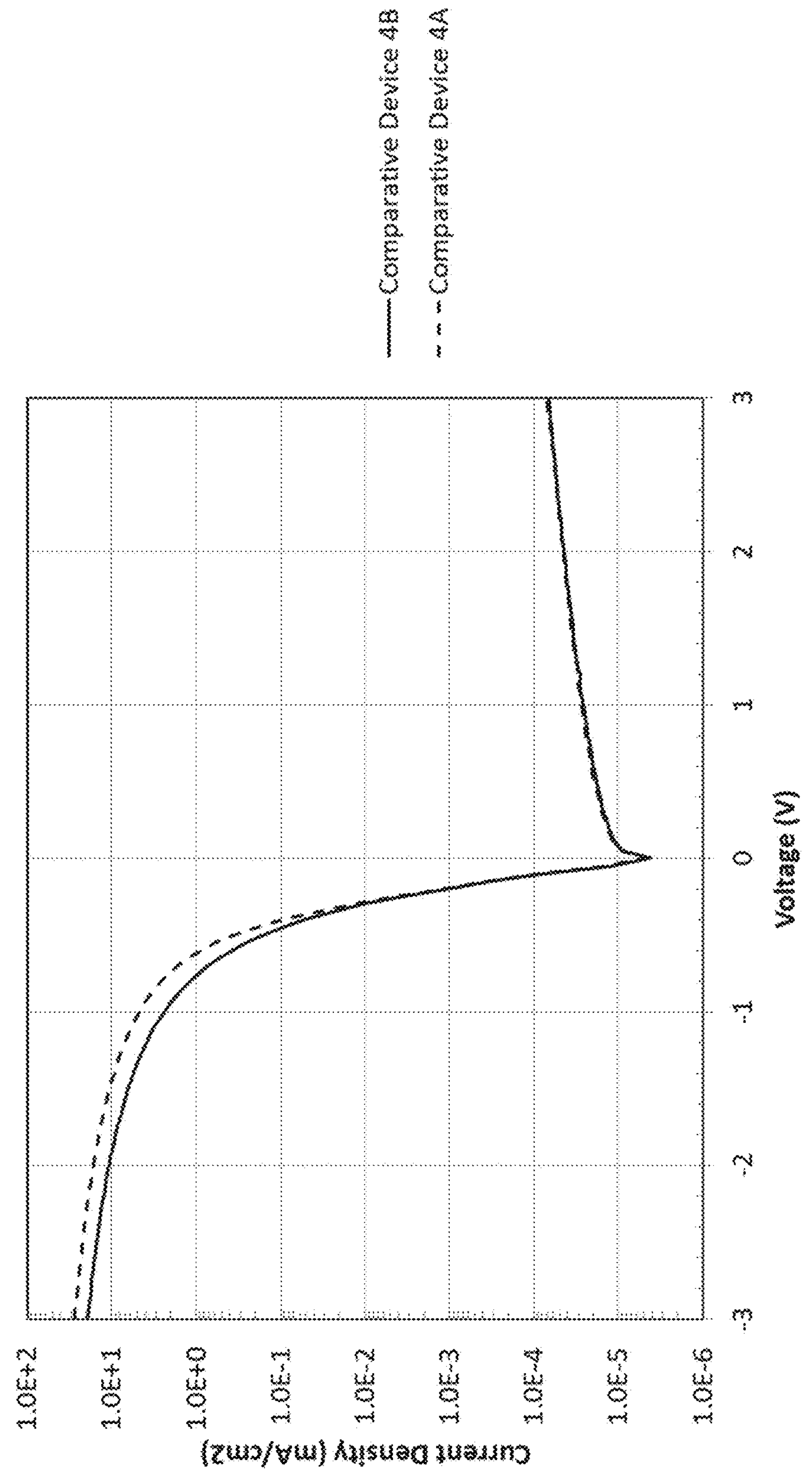
FIG. 7B shows the dark currents for the devices of FIG. 7A.

With reference to FIG. 6A, although an increase in external quantum efficiency is observed upon inclusion of a fullerene in the photoactive layer, the increase is much smaller than that observed for Device Example 1 or 2A.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A composition comprising an electron donor, a fullerene electron acceptor and a non-fullerene electron acceptor wherein the non-fullerene electron acceptor is a compound of formula (I):

(I)

wherein each EAG is an electron accepting group; and EDG is an electron-donating group of formula (II) or (III):

(II)

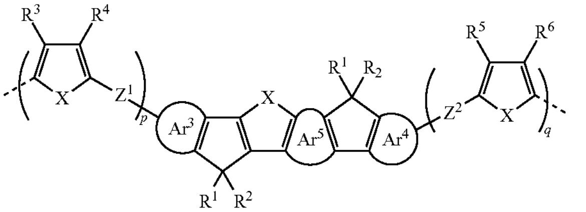

(III)

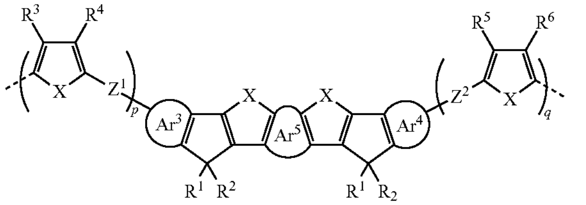

wherein:

each X is independently O or S;

$Ar^3$ and $Ar^4$ independently in each occurrence is a monocyclic or polycyclic aromatic or heteroaromatic group;

$Ar^5$ is selected from the group consisting of thiophene, furan and benzene which is unsubstituted or substituted with one or two substituents;

$R^1$ and $R^2$ independently in each occurrence is a substituent;

$R^4$ and $R^5$ are each independently H or a substituent;

$R^3$ and $R^6$ are each independently H, a substituent or a divalent group bound to EAG;

$Z^1$ is a direct bond or $Z^1$ together with the substituent $R^4$ forms $Ar^1$ wherein $Ar^1$ is a monocyclic or polycyclic aromatic or heteroaromatic group;

$Z^2$ is a direct bond or $Z^2$ together with the substituent $R^5$ forms $Ar^2$ wherein $Ar^2$ is a monocyclic or polycyclic aromatic or heteroaromatic group;

p is 1, 2 or 3;

q is 1, 2 or 3; and

---- is a point of attachment to EAG.

2. The composition according to claim 1 wherein $Ar^3$ and $Ar^4$ are each independently selected from thiophene, furan, furofuran and thienothiophene.

3. The composition according to claim 1 wherein EAG is selected from formulae (IIa) and (IIIa):

(IIa)

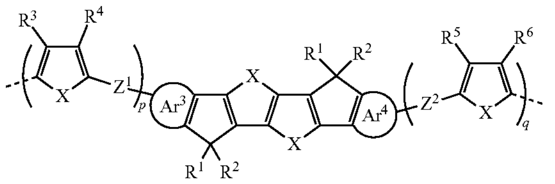

(IIIa)

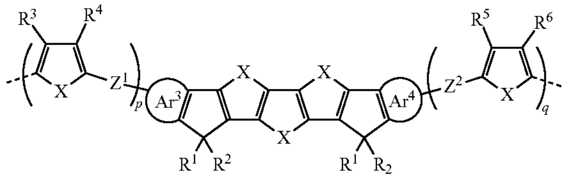

4. The composition according to claim 1 wherein EAG is selected from formulae (IIb) and (IIIb):

(IIb)

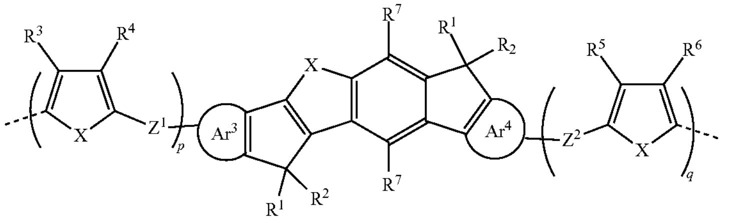

(IIIb)

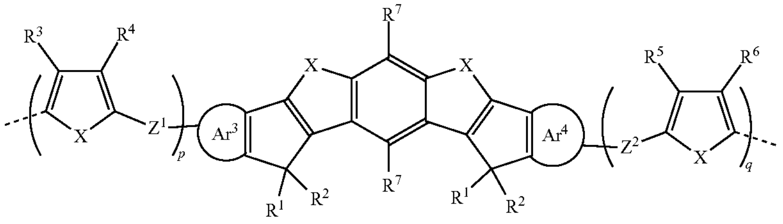

wherein $R^7$ in each occurrence is independently H or a substituent.

5. The composition according to claim 1 wherein at least one of p and q is 2.

6. The composition according to claim 1 wherein $Z^1$ is linked to $R^4$ to form a monocyclic aromatic or heteroaromatic group and/or $Z^2$ is linked to $R^5$ to form a monocyclic aromatic or heteroaromatic group.

7. The composition according to claim 6 wherein $Z^1$ is linked to $R^4$ to form a thiophene ring or thienothiophene and/or $Z^2$ is linked to $R^5$ to form a thiophene ring or thienothiophene.

8. The composition according to claim 1 wherein each EAG is a group of formula (V):

(V)

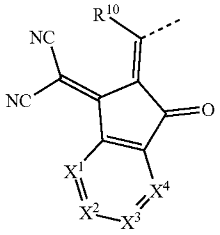

wherein:

$R^{10}$ in each occurrence is H or a substituent;

---- represents a linking position to EDG; and each $X^1$-$X^4$ is independently $CR^{13}$ or N wherein $R^{13}$ in each occurrence is H or a substituent.

9. The composition according to claim 8 wherein each $R^{13}$ is independently selected from H; $C_{1-12}$ alkyl; and an electron withdrawing group.

10. The composition according to claim 9 wherein the electron withdrawing group is F or CN.

11. The composition according to claim 1 wherein $R^1$ and $R^2$ in each occurrence is selected from the group consisting of:

linear, branched or cyclic $C_{1-20}$ alkyl wherein one or more non-adjacent, non-terminal C atoms may be replaced by O, S, $NR^{12}$, CO or COO wherein $R^{12}$ is a $C_{1-12}$hydrocarbyl and one or more H atoms of the $C_{1-20}$ alkyl may be replaced with F; and a group of formula (Ak)u-($Ar^6$)v wherein Ak is a $C_{1-12}$ alkylene chain in which one or more C atoms may be replaced with O, S, CO or COO; u is 0 or 1; $Ar^6$ in each occurrence is independently an aromatic or heteroaromatic group which is unsubstituted or substituted with one or more substituents; and v is at least 1.

12. The composition according to claim 11 wherein at least one of $R^1$ and $R^2$ is phenyl which is unsubstituted or substituted with one or more substituents selected from $C_{1-20}$alkyl wherein one or more non-adjacent, non-terminal C atoms may be replaced by O, S, $NR^{12}$, CO or COO and one or more H atoms of the $C_{1-20}$ alkyl may be replaced with F.

13. The composition according to claim 1 wherein each $R^3$-$R^6$ is independently selected from:

H;

$C_{1-12}$ alkyl wherein one or more non-adjacent, non-terminal C atoms may be replaced with O, S, COO or CO; and an aromatic or heteroaromatic group $Ar^5$ which is unsubstituted or substituted with one or more substituents.

14. The composition according to claim 4 wherein each $R^7$ independently in each occurrence is selected from:

H;

$C_{1-12}$ alkyl wherein one or more non-adjacent, non-terminal C atoms may be replaced with O, S, COO or CO; and an aromatic or heteroaromatic group $Ar^5$ which is unsubstituted or substituted with one or more substituents.

15. An organic photodetector comprising: an anode; a cathode; and a photosensitive organic layer disposed between the anode and cathode wherein the photosensitive organic layer comprises the composition according to claim 1.

16. A method of forming the organic photodetector according to claim 15 comprising formation of the photosensitive organic layer over one of the anode and cathode and formation of the other of the anode and cathode over the photosensitive organic layer.

17. A method according to claim 16 wherein formation of the photosensitive organic layer comprises deposition of a formulation comprising the compound of formula (I) and the electron donor dissolved or dispersed in one or more solvents.

18. A photosensor comprising a light source and an organic photodetector according to claim 15 configured to detect light emitted from the light source.

19. A photosensor according to claim 18 wherein the light source emits light having a peak wavelength greater than 750 nm.

20. A formulation comprising the composition of claim 1, wherein the composition is dissolved or dispersed in one or more solvents.

* * * * *